(12) United States Patent
Malmhall et al.

(10) Patent No.: US 8,802,451 B2
(45) Date of Patent: Aug. 12, 2014

(54) METHOD FOR MANUFACTURING HIGH DENSITY NON-VOLATILE MAGNETIC MEMORY

(75) Inventors: Roger Klas Malmhall, San Jose, CA (US); Kimihiro Satoh, Beaverton, OR (US); Jing Zhang, Los Altos, CA (US); Parviz Keshtbod, Los Altos Hills, CA (US); Rajiv Yadav Ranjan, San Jose, CA (US)

(73) Assignee: Avalanche Technology Inc., Fremont, CA (US)

( * ) Notice: Subject to any disclaimer, the term of this patent is extended or adjusted under 35 U.S.C. 154(b) by 22 days.

(21) Appl. No.: 13/610,587

(22) Filed: Sep. 11, 2012

(65) Prior Publication Data
US 2013/0244344 A1    Sep. 19, 2013

Related U.S. Application Data

(63) Continuation-in-part of application No. 12/040,827, filed on Feb. 29, 2008, now Pat. No. 8,535,952.

(51) Int. Cl.
*H01L 21/00* (2006.01)

(52) U.S. Cl.
USPC ........ 438/3; 257/295; 257/421; 257/E27.005; 257/E43.006

(58) Field of Classification Search
USPC ........ 438/3; 257/295, 421, E27.005, E43.006
See application file for complete search history.

(56) References Cited

U.S. PATENT DOCUMENTS

| | | | |
|---|---|---|---|
| 3,665,264 A | 5/1972 | Yukami et al. | |
| 5,060,098 A | 10/1991 | Gotoh et al. | |
| 5,695,864 A | 12/1997 | Slonczewski | |
| 6,072,718 A | 6/2000 | Abraham et al. | |
| 6,169,689 B1 | 1/2001 | Naji | |
| 6,285,581 B1 | 9/2001 | Tehrani et al. | |
| 6,365,419 B1 | 4/2002 | Durlam et al. | |

(Continued)

FOREIGN PATENT DOCUMENTS

| | | |
|---|---|---|
| JP | 2002197851 | 7/2002 |
| JP | 2004006774 | 1/2004 |

(Continued)

OTHER PUBLICATIONS

Abraham, D W, Rapid-turnaround characterization methods for MRAM development, IBM J Res & Dev , vol. 50, No. 1, Jan. 2006, pp. 55-67.

(Continued)

*Primary Examiner* — Andy Huynh
(74) *Attorney, Agent, or Firm* — G. Marlin Knight

(57) ABSTRACT

Methods of fabricating MTJ arrays using two orthogonal line patterning steps are described. Embodiments are described that use a self-aligned double patterning method for one or both orthogonal line patterning steps to achieve dense arrays of MTJs with feature dimensions one half of the minimum photo lithography feature size (F). In one set of embodiments, the materials and thicknesses of the stack of layers that provide the masking function are selected so that after the initial set of mask pads have been patterned, a sequence of etching steps progressively transfers the mask pad shape through the multiple mask layer and down through all of the MTJ cell layers to the form the complete MTJ pillars. In another set of embodiments, the MTJ/BE stack is patterned into parallel lines before the top electrode layer is deposited.

9 Claims, 25 Drawing Sheets

(56) References Cited

U.S. PATENT DOCUMENTS

| | | | |
|---|---|---|---|
| 6,421,270 B1 | 7/2002 | Tai | |
| 6,469,926 B1 | 10/2002 | Chen | |
| 6,501,139 B1 | 12/2002 | Petti | |
| 6,590,806 B1 | 7/2003 | Bhattacharyya | |
| 6,603,677 B2 | 8/2003 | Redon et al. | |
| 6,639,312 B2 | 10/2003 | Herner et al. | |
| 6,642,595 B1 | 11/2003 | Hung et al. | |
| 6,649,451 B1 | 11/2003 | Vyvoda et al. | |
| 6,670,660 B2 | 12/2003 | Hosotani | |
| 6,697,294 B1 | 2/2004 | Qi et al. | |
| 6,714,444 B2 | 3/2004 | Huai et al. | |
| 6,716,644 B2 * | 4/2004 | Nejad et al. | 438/3 |
| 6,724,585 B2 | 4/2004 | Hayashi | |
| 6,743,642 B2 | 6/2004 | Costrini et al. | |
| 6,744,086 B2 | 6/2004 | Daughton et al. | |
| 6,759,263 B2 | 7/2004 | Ying et al. | |
| 6,780,652 B2 * | 8/2004 | Lee | 438/3 |
| 6,783,999 B1 | 8/2004 | Lee | |
| 6,785,159 B2 * | 8/2004 | Tuttle | 365/158 |
| 6,821,907 B2 | 11/2004 | Hwang et al. | |
| 6,893,893 B2 | 5/2005 | Nallan et al. | |
| 6,905,578 B1 | 6/2005 | Moslehi et al. | |
| 6,920,063 B2 | 7/2005 | Huai et al. | |
| 6,933,155 B2 | 8/2005 | Albert et al. | |
| 6,964,928 B2 | 11/2005 | Ying et al. | |
| 6,984,529 B2 | 1/2006 | Stojakovic et al. | |
| 6,984,561 B2 | 1/2006 | Herner et al. | |
| 6,984,585 B2 | 1/2006 | Ying et al. | |
| 6,985,385 B2 | 1/2006 | Nguyen et al. | |
| 6,992,359 B2 | 1/2006 | Nguyen et al. | |
| 6,995,422 B2 | 2/2006 | Herner et al. | |
| 7,002,781 B2 | 2/2006 | Sugawara | |
| 7,005,730 B2 | 2/2006 | Verma et al. | |
| 7,009,877 B1 | 3/2006 | Huai et al. | |
| 7,018,878 B2 | 3/2006 | Vyvoda et al. | |
| 7,023,725 B2 | 4/2006 | Saito et al. | |
| 7,023,739 B2 | 4/2006 | Chen et al. | |
| 7,026,673 B2 | 4/2006 | Abraham | |
| 7,057,921 B2 | 6/2006 | Valet | |
| 7,088,609 B2 | 8/2006 | Valet | |
| 7,106,624 B2 | 9/2006 | Huai et al. | |
| 7,109,539 B2 | 9/2006 | Lu | |
| 7,120,049 B2 | 10/2006 | Nakamura et al. | |
| 7,122,386 B1 | 10/2006 | Torng et al. | |
| 7,123,498 B2 | 10/2006 | Miyatake et al. | |
| 7,126,201 B2 | 10/2006 | Matsutera et al. | |
| 7,148,531 B2 | 12/2006 | Daughton et al. | |
| 7,170,775 B2 | 1/2007 | Lin et al. | |
| 7,183,130 B2 | 2/2007 | Neutzel et al. | |
| 7,211,446 B2 | 5/2007 | Gaidis et al. | |
| 7,863,060 B2 | 1/2011 | Belen et al. | |
| 2002/0048128 A1 | 4/2002 | Kamiguchi et al. | |
| 2003/0108776 A1 | 6/2003 | Chang et al. | |
| 2003/0123200 A1 | 7/2003 | Nagasaka et al. | |
| 2003/0128483 A1 | 7/2003 | Kamijo | |
| 2003/0180776 A1 | 9/2003 | Wu et al. | |
| 2003/0232223 A1 | 12/2003 | Leddy et al. | |
| 2004/0042128 A1 | 3/2004 | Slaughter et al. | |
| 2004/0130396 A1 | 7/2004 | Nguyen et al. | |
| 2004/0159832 A1 | 8/2004 | Hack | |
| 2004/0170055 A1 | 9/2004 | Albert et al. | |
| 2004/0201070 A1 | 10/2004 | Deak | |
| 2005/0045913 A1 | 3/2005 | Nguyen et al. | |
| 2005/0063222 A1 | 3/2005 | Huai et al. | |
| 2005/0105325 A1 | 5/2005 | Haneda et al. | |
| 2005/0167657 A1 | 8/2005 | Nickel et al. | |
| 2005/0195532 A1 | 9/2005 | Sugiyama et al. | |
| 2005/0201020 A1 | 9/2005 | Fuke et al. | |
| 2005/0207219 A1 | 9/2005 | Lee et al. | |
| 2005/0254287 A1 | 11/2005 | Valet et al. | |
| 2006/0017081 A1 | 1/2006 | Sun et al. | |
| 2006/0081953 A1 | 4/2006 | Nguyen et al. | |
| 2006/0083056 A1 | 4/2006 | Daughton et al. | |
| 2006/0104110 A1 | 5/2006 | Sun et al. | |
| 2006/0109591 A1 | 5/2006 | Ranjan et al. | |
| 2006/0114620 A1 | 6/2006 | Sbiaa et al. | |
| 2006/0141640 A1 | 6/2006 | Huai et al. | |
| 2006/0171198 A1 | 8/2006 | Saito et al. | |
| 2006/0187703 A1 | 8/2006 | Mizuguchi et al. | |
| 2006/0192237 A1 | 8/2006 | Huai | |
| 2006/0227465 A1 | 10/2006 | Inokuchi et al. | |
| 2006/0239066 A1 | 10/2006 | Liaw | |
| 2006/0268604 A1 | 11/2006 | Onogi et al. | |
| 2007/0007609 A1 | 1/2007 | Saito et al. | |
| 2007/0085068 A1 | 4/2007 | Apalkov et al. | |
| 2007/0164336 A1 | 7/2007 | Saito et al. | |
| 2008/0043519 A1 | 2/2008 | Kitagawa et al. | |
| 2010/0327248 A1 * | 12/2010 | Khoueir et al. | 257/2 |

FOREIGN PATENT DOCUMENTS

| | | |
|---|---|---|
| JP | 2006157027 | 6/2006 |
| JP | 2006269530 | 10/2006 |
| JP | 2006277864 | 10/2006 |
| JP | 2006295198 | 10/2006 |
| JP | 2007073971 | 3/2007 |
| JP | 2007096105 | 4/2007 |
| JP | 2007142364 | 6/2007 |

OTHER PUBLICATIONS

Acremann, Y, et al, Time Resolved Imaging of Spin Transfer Switching: Beyond the Macro-Spin Concept, PRL 96, 217202 (2006), 4 pp.

Albert, F J, et al, Quantitative Study of Magnetization Reversal by Spin-Polarized Current in Magnetic Multilayer Nanopillars, Physical Review Letters, vol. 89, No. 22, Nov. 25, 2002, 4 pp.

Albert, F J, et al, Spin-Polarized Current Switching of a CO Thin Film Nanomagnet, Applied Physics Letters, vol. 77, No. 23, Dec. 4, 2000, pp. 3809-3811.

Anderson, J M, et al, Address line-assisted switching of vertical magnetoresistive random access memory (VMRAM) cells, 49th Conference on Magnetism and Magnetic Materials, 15 pp.

Apalkov, D, et al, Temperature Dependence of Spin Transfer Switching in Nanosecond Regime, IEEE Transactions on Magnetics, vol. 42, No. 10, Oct. 2006, pp. 2685-2687.

Arghavani, R, Technologies to Enable High-k Metal Gate Implementation, Semicon West 2007, Jul. 17, 2007, 20 pp.

Attema, J J, et al, Spintronic Materials Based on Main-Group Elements, J Phys: Condens Matter 19 (2007) 11 pp.

Balke, B, et al, Mn3Ga, a compensated ferrimagnet with high Curie temperature and low magnetic moment for spin torque transfer applications, Appl Phys Lett 90, 152504 (2007), 3 pp.

Barnas, J, et al, Current-Induced Switching in Spin-Valve Structures, Phys Stat Sol (B) 244, No. 7, pp. 2304-2310.

Barnetson, D, QDMtm Flash Memory, Semicon West 2007, Jul. 17, 2007, 18 pp.

Bazaliy, Y B, et al, Nonlinear Regimes of Current-Induced Domain Wall Motion, 29 pp.

Beach, G S D, et al, Dynamics of field-driven domain-wall propagation in ferromagnetic nanowires, Nature Materials 4,741-744(2005).

Berakdar, J, et al, Spin Transport and Spin Torque in a Magnetic Nanowire With a Non-Collinear Magnetic Order, J Physics: Conference Series 61 (2007) 105-109.

Berger, L, Emission of spin waves by a magnetic multilayer traversed by a current, Phys Rev B, vol. 54, No. 13, Oct. 1, 1996, pp. 9353-9358.

Berger, L, Emission of Spin Waves by a Magnetic Nulitlayer Traversed by a Current, Article, October 1, 1996, 6 Pages, vol. 54, No. 13, The American Physical Society.

Berger, L, Multilayer configuration for experiments of spin precession induced by a dc current, J Appl Phys, vol. 93, No. 10, Parts 2 & 3, May 15, 2003, pp. 7693-7695.

Berger, L, Relation Between Damping, Current-Induced Torques, and Wall Resistance for Domain Walls in Magnetic Nanowires, Physical Review B 75, 174401 (2007),5 pp.

Bibes, M, et al, Oxide Spintronics, IEEE Trans on Electron Devices, vol. 54, No. 5, May 2007, pp. 1003-1023.

Boeve, H, et al, Technology Assessment for the Implementation of Magnetoresistive Elements With Semiconductor Components in

(56) References Cited

OTHER PUBLICATIONS

Magnetic Random Access Memory (MRAM) Architecture, IEEE Transactions on Magnetics, vol. 35, No. 5, Sep. 1999, pp. 2820-2825.
Boslet, M, IBM to reveal chip advance, Nanotechnology Boosts Products' Speed, Efficiency, Mercury News, 3 pp.
Boulle, O, et al, Shaped Angular Dependence of the Spin-Transfer Torque and Microwave Generation Without Magnetic Field, Nature Physics, vol. 3, Jul. 2007, pp. 492-497.
Bowen, M, et al, Using half-metallic manganite interfaces to reveal insights into spintronics, J Phys : Condens Matter 19 (2007) 315208, 27 pp.
Braganca, P M, et al, Reducing the Critical Current for Short-Pulse Spin-Transfer Switching of Nanomagnets, Applied Physics Letters 87, 112507 (2005),3 pp.
Buehler, M, CMP Challenges for 32nm, Semicon West 2007, Jul. 2007,21 pp.
Burton, J D, et al, Atomic and Electronic Structure of the COFEB/MGO Interface From First Principles, 3 pp.
Carpentieri, M, et al, Micromagnetic Investigation of Precession Dynamics in Magnetic Nanopillars, IEEE Transactions on Magnetics, vol. 43, No. 6, Jun. 2007, pp. 2935-2937.
Carson, J C, et al, High Density Packaging of Non-Volatile Memory, Irvine Sensors Corporation, 3 pp.
Chang, RL, et al, Modeling the electrical effects of metal dishing due to CMP for on-chip interconnect optimization, University of California Postprints, 2004, Paper 52, 9 pp.
Chen, L, Breakthrough Technology for CMP, Semiconductor Fabtech—24th Ed, pp. 137-141.
Chen, S-P, et al, Spin Accumulation from the Spin Hall Effect Studied Using the Effective Mean-Free-Path Model, IEEE Transactions on Magnetics, vol. 42, No. 10, Oct. 2006, pp. 2667-2669.
Chen, T et, al, Oxygen-Pressure Dependence of the Crystallinity of MGO Films Grown on Si(1 00) by Pld, Journal of Crystal Growth 270 (2004), pp. 553-559.
Chen, T Y, et al, Current-Driven Switching in a Single Exchange-Biased Ferromagnetic Layer, J Appl Phys 97, 10C709 (2005) 3 pp.
Chen, TY, et al, Current-Induced Switching in a Single Exchange-Biased Ferromagnetic Layer, J Appl Phys 97, 10C709 (2005) 3 pp.
Chen, TY, et al, Enhanced Magnetoresistance Induced by Spin Transfer Torque in Granular Films with a Magnetic Field, PRL 96, 207203 (2006) 4 pp.
Cherian, J G, Quantum Electrodynamics in Graphene, Kutztown University of PA, Physics REU 2006, Univ of Washington, 13 pp.
Chezan, A R, et al, Influence of stresses and magnetostriction on the soft magnetic behavior of metallic films, J Magnetism and Magnetic Materials 299 (2006) pp. 219-224.
Consolo, G, et al, Influence of Different Spatial Distributions of Current Density and Spin-Torque Efficiency in the Dynamics of Point-Contact Devices, IEEE Transactions on Magnetics, vol. 43, No. 6, Jun. 2007,2827-2829.
Consolo, G, et al, Magnetization dynamics in nanocontact current controlled oscillators, Phys Rev B 75, 214428 (2007), 6 pp.
Consolo, G, et al, Spin-Torque Switching in PY/CU/PY and PY/CU/COPT Spin-Valve Nanopillars, Journal of Magnetism and Magnetic Materials 316 (2007) 492-495.
Covington, M, Spin transfer and other challenges in data storage, Seagate Research, Pittsburgh, PA, 27 pp.
Coyne, J, Storage Markel: Opportunities, Myths and Facts, Western Digital, May 17, 2007, 24 pp.
Craig, B R, et al, The effect of roughness on the micromagnetic properties of high moment multilayer films, J Phys D: Appl Phys 40 (2007), pp. 3991-3997.
Daibou, T, et al, Tunnel Magnetoresistance Effect in COFEB/MGO/COXFESI and C02MNSI Tunnel Junctions, IEEE Transactions on Magnetics, vol. 42, No. 10, Oct. 2006, pp. 2655-2657.
Daughton, J, Magnetic Spin Devices: 7 Years from Lab to Product, Symposium X, MRS 2004 Fall Meeting, Dec. 1, 2004,27 pp.
Daughton, J, Spintronic Applications At NVE, Cornell University, May 14, 2004, 39 pp.

Dave, RW, et al, MgO-Based Tunnel Junction Material for High-Speed Toggle Magnetic Random Access Memory, IEEE Transactions on MagnetiCS, vol. 42, No. 8, Aug. 2006, pp. 1935-1939.
Deak, J, et al, Effect of Resistance-Area-Product and Thermal Environment on Writing of Magneto-Thermal MRAM, Mar. 13, 2006, 3 pp.
Deak, J, Thermal Magnetic Random Access Memory, IEEE International Conference on Computer Design, New Memory Technologies, Oct. 4, 2005,38 pp.
Deak, J G, Spin Injection in Thermally Assisted Magnetic Random Access Memory, NVE Corporation, 15 pp.
Debrosse, J, Circuit Considerations for Spin-Switched MRAM Devices, IBM Microelectronics, May 14, 2004,15 pp.
delMoral, A, Magnetostriction: Fundamental Principles and Novel Magneto-Strictive Materials, Europhysics News (2003 vol. 34, No. 6 , 9 pp.
Demidov, V E, et al, Effect of spin-polarized electric current on spin-wave radiation by spin-valve nanocontacts, Appl Phys Lett 90, 172508 (2007), 3 pp.
Derbenwick, G F, et al, Advances in Feram Technologies, Celis Semiconductor Corporation, 3 pp.
Devolder, T, et al, Distribution of the magnetization reversal duration in subnanosecond spin-transfer switching, Physical Review B 75, 064402 (2007), 5 pp.
Devolder, T, et al, Spin Transfer Oscillators Emitting Microwave in Zero Applied Magnetic Field, J Appl Phys 101, 063916 (2007), 5 pp.
Diao, Z, et al, Spin transfer switching in dual MgO magnetic tunnel junctions, Appl Phys Lett 90, 132508 (2007) 3 pp.
Diao, Z, et al, Spin-Transfer Torque Switching in Magnetic Tunnel Junctions and Spin-Transfer Torque Random Access Memory, J Phys: Condens Matter 19 (2007) 13 pp.
Dieny, B, et al, Spin Electronics, J Phys: Condens Matter 19 (2007) 3 pp.
Dieny, B, Spintronics, Hong Kong Critical Components Manufacturing Inustry Quarterly Journal (Jun. 2002), 4 pp.
Dieny, B, Spin-Valves, 104 pp.
Ding, Y, et al, Fabrication of Current-Induced Magnetization Switching Devices Using Etch-Back Planarization Process, J Appl Phys 97 (2005) 3 pp.
Dippert, B, Hitting their stride: Nonvolatile-memory upstarts draw near to established leaders, designfeature: Advanced nonvolatile memories, Jan. 20, 2005, EON 55, 6 pp.
Ditizio, R, et al, Memory: MRAM Design, Cell Shape and Patterning Considerations for Magnetic Random Access Memory (MRAM) Fabrication, Semiconductor Manufacturing Magazine, pp. 90-96.
Dittrich, R, et al, Energy barriers in magnetic random access memory elements, IEEE, 3 pp.
Durlam, M, et al, A 1-MBIT MRAM Based on 1T1MT J Bit Cell Integrated With Copper Interconnects, IEEE J of Solid-State Circuits, vol. 38, No. 5, May 2003, pp. 769-773.
Economikos, L, et al, Stl Planarization Using Fixed Abrasive Technology, Feb. 2, 2002, 1 p.
Edwards, D M, et al, Theory of Spin Current in Magnetic Nanopillars for Zero-Field Microwave Generation, J Phys : Condens Matter 19 (2007) 165210, 8 pp.
Emley, N C, et al, Reduction of spin transfer by synthetic antiferromagnets, Applied Physics Letters, vol. 84, No. 21, May 24, 2004, pp. 4257-4259.
Engel, B N, et al, A 4-MB Toggle MRAM Based on a Novel Bit and Switching Method, IEEE Transactions on Magnetics, vol. 41, No. 1, Jan. 2005, pp. 132-136.
Ernult, F, et al, Spin accumulation in metallic nanoparticles, J Phys: Condens Matter 19 (2007) 19 pp.
Finocchio, G, et al, Magnetization Dynamics in COFE/AIO/Permalloy and COFE/MGO/Permalloy Magnetic Tunnel Junctions, J Appl Phys 101, 09A508 (2007), 3 pp.
Flatte, M E, Spintronics, IEEE Trans on Electron Devices, vol. 54 , No. 5, May 2007, pp. 907-920.
Fuchs, GD, et al, Adjustable Spin Torque in Magnetic Tunnel Junctions With Two Fixed Layers, Applied Physics Letters, 86, 152509 (2005), 3 pp.

(56) References Cited

OTHER PUBLICATIONS

Fuchs, GD, et al, Spin Torque, Tunnel-Current Spin Polarization, and Magnetoresistance in MgO Magnetic Tunnel Junctions; Physical Review Letters; PRL 96, 186603 (2006); May 12, 2006.
Fuchs, GD, et al, Spin-Transfer Effects in Nanoscale Magnetic Tunnel Junctions; Applied Physics Letters; vol. 85, No. 7; Aug. 16, 2004.
Gaidis, M C, Two-level BEOI processing for rapid iteration in MRAM development, IBM J Res & Dev , vol. 50, No. 1, Jan. 2006, pp. 41-54.
Galanakis, I, et al, Spin-Polarization and Electronic Properties of Half-Metallic Heusler Alloys Calculated From First Principles, J Phys , Condens Matter 19 (2007) 315213,16 pp.
Gallagher, W J, et al, Development of the magnetic tunnel junction MRAM at IBM: From first junctions to a 16-Mb MRAM demonstrator chip, IBM J Res & Devl , vol. 50, No. 1, Jan. 2006, pp. 5-23A.
Garner, C M, Technology Challenges & Opportunities for Nanomaterials, 2007 ITRS Public Conference, 15 pp.
Gomez, RD, et al, An approach to Wearable Magnetic Random Access Memory, ECE Dept, University of Maryland, 12 pp.
Gould, C, et al, Tunneling Anisotropic Magnetoresistance-Based Devices, IEEE Trans on Electron Devices, vol. 54 , No. 5, May 2007, pp. 977-983.
Grollier, J, et al, Spin-polarized current induced switching in Co/Cu/Co pillars, App Phys Lett , vol. 78, No. 23, Jun. 4, 2001,pp. 3663-3665.
Grollier, J, et al, Switching a Spin-Valve Back and Forth by Current-Induced Domain Wall Motion, 4 pp.
Grollier, J, et al, Switching the magnetic configuration of a spin valve by current-induced domain wall motion, J App Phys , vol. 92, No. 8, Oct. 15, 2002, pp. 4825-4827.
Gu, J, et al, A Switched Decoupling Capacitor Circuit for On-Chip Supply Resonance Damping, 2007 Symp on VLSI Circuits Digest of Technical Papers, pp. 126-127.
Gu, J, et al, Distributed Active Decoupling Capacitors for On-Chip Supply Noise Cancellation in Digital VLSI Circuits, IEEE 2660 Symp on VLSI Circuits Digest ofTech Papers, 2 pp.
Guhr, I L, et al, Magnetization Reversal in Exchange Biased Nanocap Arrays, J Phys D: Appl Phys 40 (2007), pp. 3005-3010.
Guo, J, et al, Effect of Gilbert Damping Term on the Current Induced Magnetization Switching of Ring-Shaped Spin Valve Structures, IEEE Transactions on Magnetics, vol. 43, No. 6, Jun. 2007, 2923-2925.
Hajto, J, et al, Quantized Electron Transport in Amorphous-Silicon Memory Structures, Physical Review Letters, vol. 66, No. 14, Apr. 8, 1991, pp. 1918-1921.
Hayakawa, J, et al, Current-Driven Magnetization Switching in CoFeB/MgO/CoFeB Magnetic Tunnel Junctions, JJAP, vol. 44, No. 41, 2005, pp. L1267-L1270.
Hayakawa, J, et al, Current-Driven Switching of Exchange Biased Spin-Valve Giant Magnetoresistive Nanopillars Using a Conducting Nanoprobe, J Appl Phys , vol. 96, No. 6, Sep. 15, 2004, pp. 3440-34420.
Hayakawa, J, et al, Dependence of Giant Tunnel Magnetoresistance of Sputtered CoFeB/MgO/CoFeB Magnetic Tunnel Junctions on MgO Barrier Thickness and Annealing Temperature, JJAP, vol. 44, No. 19,2005, pp. L587-L589.
Hayakawa, J, et al, Effect of High Annealing Temperature on Giant Tunnel Magnetoresistance Ratio of COFE8/MGO/COFE8 Magnetic Tunnel Junctions, Appl Phys Lett 89, 232510 (2006), 3 pp.
He, J, et al, Switching speed distribution of spin-torque-induced magnetic reveral, J Appl Phys 101, 09A501 (2007), 3 pp.
Healey, J, Current Technical Trends: Dual Damascene & Low-K Dielectrics, Threshold Systems, 2002, 6 pp.
Hiki, Y, et al, Stabilization of metallic glass by isochronal and isothermal annealing treatments, J Phys : Condens Matter 19 (2007) 2005147 (7 pp).
Hoover, C, Enabling Materials for Contact Metallization, Advanced Processes for Advanced Devices, Jul. 2007, 16 pp.

Houssameddine, D, et al, Spin-torque oscillator using a perpendicular polarizer and a planar free layer, Nature Materials, vol. 6, Jun. 2007, pp. 447-453.
Hsiao, A, et al, The Thermal, Magnetic, and Structural Characterization of the Crystallization Kinetics of FE88247B4CU1, an Amorphous Soft Magnetic Ribbon, IEEE Transactions on Magnetics, vol. 38, No. 5, Sep. 2002, pp. 3039-3044.
Hsu, Y, et al, New Ni5Al3 Underlayer for Longitudinal Magnetic Recording Media, IEEE Transactions on Magnetics, vol. 38, No. 4, Jul. 2002, pp. 1803-1806.
Huai, Y, et al, Observation of Spin-Transfer Switching in Deep Submicron-Sized and Low-Resistance Magnetic Tunnel Junctions, Appl Phys Lett , vol. 84, No. 16, Apr. 19, 2004, pp. 3118-3120.
Huai, Y, et al, Spin transfer switching current reduction in magnetic tunnel junction based dual spin filter structures, Appl Phys Lett 87,222510 (2005), 3 pp.
Ikeda, S, et al, Dependence of Tunnel Magnetoresistance in MGO Based Magnetic Tunnel Junctions on AR Pressure During MGO Sputtering, 19 pp.
Ikeda, S, et al, Dependence of tunnel magnetoresistance on ferromagnetic electrode materials in MgO-barrier magnetic tunnel junctions, 9 pp.
Ikeda, S, Magnetic Tunnel Junctions for Spintronic Memories and Beyond, IEEE Trans on Electron Devices, vol. 54 , No. 5, May 2007, pp. 991-1002.
Isogami, S, et al, Current-Induced Magnetization Switching and CPP-GMR in 30 nm 01 Scale Spin Valves Fabricated Using EB-Assisted CVD Hard Masks, IEEE Transactions on Magnetics, vol. 42, No. 10, Oct. 2006, pp. 2676-2678.
Itoh, H, Theory of Tunnel Magnetoresistance and Spin Filter Effect in Magnetic Tunnel Junctions, J Phys D: Appl Phys 40 (2007) 1228-1233.
Jalil, M B A, et al, Layer thickness and angular dependence of spin transfer torque in ferromagnetic trilayers, J Appl Phys 101, 124314 (2007), 4 pp.
Jeong, S, et al, Nanostructure and Magnetic Properties of Polycrystalline FEPDPTIMGO Thin Films, J Appl Phys , vol. 91, No. 10 May 15, 2002, pp. 8813-8815.
Jeong, W C, et al, Field assisted spin switching in magnetic random access memory, Samsung Electronics Co , Ltd , 14 pp.
Ji, Y, et al, Current-Induced Spin-Wave Excitations in a Single Ferromagnetic Layer, 4 pp.
Jiang, X, et al, Highly efficient room-temperature tunnel spin injector using CoFefMgO(001), IBM J Res & Dev , vol. 50, No. 1, Jan. 2006, pp. 111-120.
Jiang, Y, et al, Effective Reduction of Critical Current for Current-Induced Magnetization Switching by a RU Layer Insertion in an Exchange-Biased Spin Valve, PRL, vol. 92, No. 16,Apr. 23, 2004, 4 pp.
Jiang, Y, et al, Substantial reduction of critical current for magnetization switching in an exchange-biased spin valve, Nature Materials, vol. 3, Jun. 2004, pp. 361-364.
Jin, W, et al, Spin-Wave Excitations in Nanopillars With Perpendicular Polarizers, IEEE Transactions on Magnetics, vol. 42, No. 10, Oct. 2006, pp. 2682-2684.
Johnson, M, Optimized Device Characteristics of lateral Spin Valves, IEEE Trans on Electron Devices, vol. 54 , No. 5, May 2007, pp. 1024-1031.
Joly, L, et al, Spin Motion of Electrons Upon Reflecting From Ferromagnetic Surfaces, IEEE Transactions on Magnetics, vol. 42, No. 10, Oct. 2006, pp. 2645-2648.
Ju, K, et al, Multibit Cells Schemes for Toggle MRAM Applications, IEEE Transactions on Magnetics, vol. 42, No. 1 0, Oct. 2006, pp. 2730-2732.
Jubert, P O, Structure and Current-Induced Motion of Magnetic Domain Walls, 4 pp.
Jung, K B, et al, Electron Cyclotron Resonance Plasma Etching of Materials for Magneto-Resistive Random Access Memory, J Elec Mater, vol. 26, No. 11, 1997, pp. 1310-1313.
Jung, S-W, et al, Current-Induced Magnetic Domain-Wall Motion by Spin Transfer Torque: Collective Coordinate Approach With Domain-Wall Width Variation, 13 pp.

(56) References Cited

OTHER PUBLICATIONS

Kaka, S, et al, Mutual phase-locking of microwave spin torque nano-oscillators, Nature Letters, vol. 437, Sep. 15, 2005, pp. 389-392.
Kalitsov, A, et al, Spin-Polarized Current-Induced Torque in Magnetic Tunnel Junctions, J Appl Phys 99, 08G501 (2006), 3 pp.
Karabacak, T, et al, Enhanced Step Coverage of Thin Films on Patterned Substrates by Oblique Angle Physical Vapor Deposition, May 22, 2004, 21 pp.
Karpan, V M, et al, Graphite and Graphene As Perfect Spin Filters, Feb. 1, 2007, 5 pp.
Karuppiah, L, et al, Overview of CMP Process Control Strategies, Applied Materials, TFG Division, Sunnyvale, CA, 10 pp.
Kasai, S, et al, Current-Driven Resonant Excitation of Magnetic Vortex, 16 pp.
Katine, J A, et al, Current-Driven Magnetization Reversal and Spin-Wave Excitations in Co/Cu/Co Pillars, Physical Review Letters, vol. 84, No. 14, Apr. 3, 2000, pp. 3149-3152.
Kawahara, T, et al, 2MB Spin-Transfer Torque RAM (SPRAM) With Bit-By-Bit Bidirectional Current Write and Parallelizing-Direction Current Read, ISSCC 2007, Session 26, Non-volatile Memories, 26 5, pp. 480-481.
Keane, J, et al, An On-Chip NBTI Sensor for Measuring PMOS Threshold Voltage Degradation, ISLPED '07, Aug. 27-29, 2007, pp. 189-194.
Kent, A, A Nanomagnet Oscillator, Nature Materials, vol. 6, Jun. 2007, pp. 399-400.
Kil, J, et al, A High-Speed Variation-Tolerant Interconnect Technique for Sub-Threshold Circuits Using Capacitive Boosting, ISLPED '06, Oct. 4-6, 2006, pp. 67-72.
Kim, CH, et al, A Process Variation Compensating Technique for Sub-90nm Dynamic Circuits, 2003 Symp on VLSI Circuits Digest of Technical Papers, pp. 205-207.
Kim, CH, et al, An On-Die CMOS Leakage Current Sensor for Measuring Process Variation in Sub-90nm Generations, 2005 IEEE International Conference on Integrated Circuit and Technology, 2 pp.
Kim, CH, et al, PVT—Aware Leakage Reduction for On-Die Caches With Improved Read Stability, 2005 IEEE International Solid-State Circuits Conference, 3 pp.
Kim, CH, et al, PVT—Aware Leakage Reduction for On-Die Caches With Improved Read Stability, IEEE J of Solid-State Circuits, vol. 41, No. 1, Jan. 2006, pp. 170-178.
Kim, K-S, et al, Effect of Nitrogen Incorporation to Oxidation Process on the Reliability of Magnetic Tunnel Junctions, IEEE Transactions on Magnetics, vol. 42, No. 1, Jan. 2006, pp. 2-4.
Kim, T-H, et al, A 0.2 V, 480 kb Subthreshold SRAM With 1 k Cells Per Bitline for Ultra-Low-Voltage Computing, IEEE J of Solid-State Circuits, vol. 43, No. 2, Feb. 2008, pp. 518-529.
Kim, T-H, et al, A High-Density Subthreshold SRAM With Data-Independent Bitline Leakage and Virtual Ground Replica Scheme, 2007 IEEE International Solid-State Circuits Conference, 3 pp.
Kim, T-H, et al, Silicon Odometer: An On-Chip Reliability Monitor for Measuring Frequency Degradation of Digital Circuits, 2007 Symp on VLSI Circuits Digest of Technical Papers, pp. 122-123.
Kim, T-H, et al, Silicon Odometer: An On-Chip Reliability Monitor for Measuring Frequency Degradation of Digital Circuits, IEEE J of Solid-State Circuits, vol. 43, No. 4, Apr. 2008, pp. 874-880.
Kim, W J, et al, Effect of ac on current-induced domain wall motion, J Appl Phys 101, 09A504 (2007), 3 pp.
Kim, Y K, et al, Investigation of Magnetoresistive Characteristics of Metallic Multilayers Comprising Ru-Based Synthetic Antiferromagnetic Layers, J Korean Phys Soc, vol. 43, No. 3, September 2003, pp. 396-399.
Kimura, T, et al, Spin transport in lateral ferromagnetic/nonmagnetic hybrid structures, J Phys: Condens Matter 19 (2007) 13 pp.
Kimura, T, et al, Spin-Current-Assisted Domain-Wall Depinning in a Submicron Magnetic Wire, J App Phys, vol. 94, No. 12, Dec. 15, 2003, pp. 7947-7949.
Kiselev, S, et al, Current-Induced Nanomagnetic Dynamics for Magnetic Fields Perpendicular to the Sample Plane, Physical Review Letters, vol. 93, No. 3, Jul. 16, 2004, 4 pp.
Kiselev, S, et al, Spin-Transfer Excitations of Permalloy Nanopillars for Large Applied Currents, Physical Review B 72, 064430 (2005), 10 pp.
Kiselev, S, et al, Spin-Transfer-Driven Magnetic Switching and Precession, Nanomagnetics Workshop, May 14, 2004, 25 pp.
Klaui, M, et al, Direct Observation of Domain-Wall Configurations Transformed by Spin Currents, Physical Review Letters 95, 026601 Jul. 8, 2005, 4 pp.
Knight, G, Probe-Based Storage: Mechanical Access on a Nano-Scale, International Storage Technology Symposium, Jun. 18-21, 2007, 16 pp.
Knight, G, Semiconductor/Flash Memory Overview, International Storage Technology Symposium, Jun. 18-21, 2007, 19 pp.
Komineas, S, Propagating Coherent Structures in Nanowires, International Storage Technology Symposium, Jun. 18-21, 2007, 12 pp.
Kong, J H, et al, Magnetization Reversal of Co\Cu\Co Pillars by Spin-Polarized Current With Magnetic Fields, J Korean Phys Soc, vol. 46, No. 4, Apr. 2005, pp. 931-936.
Krivorotov, I N, et al, Large-amplitude coherent spin waves exited by spin-polarized current in nanoscale spin valves, 24 pp.
Krivorotov, I N, et al, Temperature Dependence of Spin-Transfer-Induced Switching of Nanomagnets, Physical Review Letters, vol. 93 No. 16, Oct. 15, 2004, 4 pp.
Krivorotov, I N, et al, Time-Domain Measurements of Nanomagnet Dynamics Driven by Spin-Transfer Torques, Science, vol. 307, Jan. 14, 2005.
Kryder, M H, Perspective on Future Storage Technologies, International Storage Technology Symposium, Jun. 18-21, 2007, 35 pp.
Kubota, H, et al, Dependence of spin-transfer switching current on free layer thickness in Co-Fe-B/MgO/Co-Fe-B magnetic tunnel junctions, App Phys Letters 89,032505 (2006) (3 pp).
Kumar, S B, et al, MR Enhancement in a Current Perpendicular-To-Plane Spin Valve by Insertion of a Ferromagnetic Layer Within the Space Layer, IEEE Transactions on Magnetics, vol. 42, No. 10, Oct. 2006, pp. 2459-2461.
Kumar, S B, et al, The Effect of Spreading Resistance on the Magnetoresistance of Current-Perpendicular-to-Plane Spin Valves With Patterned Layers, IEEE Transactions on Magnetics, vol. 42, No. 10, Oct. 2006, pp. 3788-3790.
Lai, J-Y, et al, Evolution of Copper-Oxide Damascene Structures in Chemical Mechanical Polishing, J Electrochem Soc, 149 (1), 2002, pp. G41-G50.
Lai, J-Y, Mechanics, Mechanisms, and Modeling of the Chemical Mechanical Polishing Process, MIT, Feb. 2001, 314 pp.
Lammers, D, MRAM Debut Cues Memory Transition, Jul. 10, 2006, 1 p.
Laribi, S, et al, Reversible and irreversible current induced domain wall motion in CoFeB based spin valves stripes, Appl Phys Lett 90, 232505 (2007), 3 pp.
Laufenberg, M, Dissertation, Interactions Between Current and Domain Wall Spin Structures, Jul. 26, 2006, 210 pp.
Lee, J, et al, Nano Spin Transistor, 33 pp.
Lee, J C, et al, Stability Enhancement of Nanopillar Structure for Spin Transfer Magnetization Switching Using IRMN Buffer Layer, J Appl Phys 99, 08G517 (2006), 3 pp.
Lee, J M, et al, Current-Induced Magnetization Switching Probability in MgO-Based Magnetic Tunnel Junctions, IEEE Transactions on Magnetics, vol. 43, No. 2, Feb. 2007, pp. 917-919.
Lee, J M, et al, Spin Transfer Magnetization Switching Readlwrite Cycle Test in MGO-Based Magntic Tunnel Junctions, IEEE Transactions on Magnetics, vol. 43, No. 7, Jul. 2007, 3349-3353.
Lee, J W, et al, A Planarization Model in Chemical Mechanical Polishing of Silicon Oxide Using High Selective Ce02 Slurry, Samsung Electronics, 1 p.
Lee, J W, et al, High-Density Plasma Etching of COFESIB Magnetic Films With Hard Mask, Journal of Magnetism and Magnetic Materials 304 (2006), pp. C282-C284.
Lee, K J, Excitations of Incoherent Spin-Waves due to Spin-Transfer Torque, pp. 1-14.
Lee, Y M, et al, Giant Tunnel Magnetoresistance and High Annealing Stability in COFE8/MGO/COFE8 Magntic Tunnel Junctions With Synthetic Pinned Layer, Appl Phys Lett 89, 042506 (2006), 3 pp.

(56) References Cited

OTHER PUBLICATIONS

Lenssen, J, et al, Expectations of MRAM in comparison with other non-volatile memory technologies, 6 pp.

Ihu, X, et al, Spin Torque and Field-Driven Perpendicular MRAM Designs Scalable to Multi-GB/Chip Capacity, IEEE Transactions on Magnetics, vol. 42, No. 10, Oct. 2006, pp. 2739-2741.

Li, H F, et al, Nanocrystallisation of an Fe44 5Co44 4Zr7B4 amorphous magnetic alloy, Philosophical Magazine, vol. 86, No. 10, Apr. 1, 2006, pp. 1355-1372.

Liu, S Q, et al, A New Concept for Non-Volatile Memory: The Electric-Pulse Induced Resistive Change Effect in Colossal Magnetoresistive Thin Films, Space Vacuum Epitaxy Center, 7 pp.

Liu, X, et al, Thermal stability of magnetic tunneling junctions with MgO barriers for high temperature spintronics, Appl Phys Lett 89, 023504 (2006) 3 pp.

Lo, T N, et al, E-Beam Lithography and Electrodeposition Fabrication of Thick Nanostructured Devices, J Phys D: Appl Phys 40 (2007) pp. 3172-3176.

Lu, B, et al, The Physics of Ultrahigh-Density Magnetic Recording (Springer Series in Surface Sciences, 41), Chapter 2, Microstructure of Longitudinal Media, 38 pp.

Lua, S Y H, et al, Effect of an Exchange Tab on the Magnetization Switching Process of Magnetic Nanowires, J Phys D: Appl Phys 40 (2007) 3011-3015.

Lupo, OW, Thin Film Electronics ASA, ThinFilm Presentation, May 9, 2007, Thin Film Electronics, 33 pp.

Iutic, I, et al, Spintronics: Fundamentals and Applications, Reviews of Modern Physics, vol. 76, Apr. 2004, pp. 323-410.

Maat, S, et al, Magnetotransport propeties and spin-torque effects in current perpendicular to the plane spin valves with Co-Fe-Al magnetic layers, J Appl Phys 101, 093905 (2007), 6 pp.

MacGillivray, G, Flash Memory Trends & Perspectives, Semiconductor Insights, 24 pp.

Maffitt, T M, et al, Design considerations for MRAM, IBM J Res & Devl , vol. 50, No. 1, Jan. 2006, pp. 25-39.

Mahorowala, A, et al, Etching of Polysilicon in an Inductively Coupled Cl2 and HBR Discharges: III Photoresist Mask Faceting, Sidewall Deposition, and Microtrenching, Mass Inst of Technology, 19 pp.

Maimon, J, et al, Chalcogenide-Based Non-Volatile Memory Technology, Mission Research Corporation, 18 p.

Manchon, A, et at, Modelling Spin Transfer Torque and Magnetoresistance in Magnetic Multilayers, J Phys Condens Matter 19 (2007) 165212, 42 pp.

Mancoff, F B, et al, Phase-locking in double-poi nt-contact spin-transfer devices, Nature Letters, vol. 437, Sep. 15, 2005, pp. 393-395.

Mangin, S, et al, Current-Induced Magnetization Reversal in Nanopillars With Perpendicular Anisotropy, Nature Materials, vol. 5, Mar. 2006, pp. 210-215.

Mao, S, et al, Commercial TMR Heads for Hard Disk Drives: Characterization and Extendibility At 300 Gbitfin2, IEEE Transactions on Magnetics, vol. 42, No. 2, Feb. 2006, pp. 97-102.

Martin, J I, et al, Ordered Magnetic Nanostructures: Fabrication and Properties, J Magnetism and Magnetic Materials 256 (2003) pp. 449-501.

Marukame, T, et al, Highly Spin-Polarized Tunneling in Fully Epitaxial Magnetic Tunnel Junctions Using Full-Heusler Alloy C02CrO 6Fe0 4AI Thin Film and MgO Tunnel Barrier, IEEE Transactions on Magnetics, vol. 42, No. 10, Oct. 2006, pp. 2652-2654.

Mayer, J, et al, TEM Sample Preparation and Fib-Induced Damage, MRS Bulletin, vol. 32, May 2007, pp. 400-407.

Meier, G, et al, Current-induced domain-wall motion in permalloy semi rings, Journal of Magnetism and Magnetic Materials 316 (2007) c966-c968.

Mendes, M J, Manipulation of Magnetization by Spin Polarized Current in GMR Devices, Rice University, Nanostructures and Nanotechnology I, Fall 2005, 12 pp.

Meng, H, et al, A Composite Free Layer for High Density Magnetic Random Access Memory with Lower Spin Transfer Current, Submitted to Appl Phys Letters, May 2006, 14 pp.

Meng, H, et al, A New Memory Cell Structure for MRAM With Low Writing Threshold, MMM 2005, University of Minnesota, 13 pp.

Meng, H, et al, Composite free layer for high density magnetic random access memory with lower spin transfer current, Appl Phys Letters 89 (2006) 3 pp.

Meng, H, et al, Composite Free Layer for High Density Magnetic Random Access Memory With Lower Spin Transfer Current; Applied Physics Letters 89, 152509; Oct. 12, 2006.

Meng, H, et al, Current confined effect of magnet nano-current-channel for magnetic random access memory, Center for Micromagnetics and Information Technology, Oct. 31, 2006.

Meng, H, et al, Low Critical Current for Spin Transfer in Magnetic Tunnel Junctions, Appl Phys Letters 88 (2006) 3 pp.

Meng, H, et al, Low critical current for spin transfer in magnetic tunnel junctions; Applied Physics Letters; 88; Feb. 23, 2006.

Meng, H, et al, Low Resistance Spin-Dependent Magnetic Tunnel Junction N With High Breakdown Voltage for Current-Induced Magnetization-Switching Devices, J Appl Phys 97 (2005) 3 pp.

Meng, H, et al, Spin Transfer Effect in Magnetic Tunnel Junction With a Nano-Current-Channel Layer in Free Layer, IEEE Trans on Magnetics, vol. 41, No. 10, Oct. 2005, pp. 2612-2614.

Meng, H, et al, Spin Transfer Effect in Magnetic Tunnel Junction With Low Resistance, The Center for Micromagnetic and Information Technology (MINT) & Department of Electrical & Computer Engineering, University of Minnesota, 2 pp.

Meng, H, et al, Spin Transfer Effect in Magnetic Tunnel Junction with Nano-Current-Channel, University of Minnesota, InterMag 2005, 14 pp.

Meng, H, et al, Spin Transfer in Magnetic Nano Devices With Perpendicular Anisotropy, MMM 2005, University of Minnesota, 13 pp.

Meng, H, et al, Spin transfer in nanomagnetic devices with perpendicular anisotropy, Appl Phys Letters 88 (2006) 3 pp.

Meng, H, et al, Spin Transfer With Low Switching Current Density, University of Minnesota, 2006 MINT Review, 14 pp.

Miao, G-X, et al, Inelastic tunneling spectroscopy of magnetic tunnel junctions based on CoFeBfMgOfCoFeB with Mg insertion layer, J Appl Phys 99, 08T305 (2006) 3 pp.

Mizushima, K, et al, Analytical Expression of Output Power Spectra of Spin-Transfer Nano-Oscillators, Journal of Magnetism and Magnetic Materials 316 (2007) C960-C962.

Moberlychan, W J, Fundamentals of Focused Ion Beam Nanostructural Processing: Below, At, and Above the Surface, MRS Bulletin, vol. 32, May 2007, pp. 414-432.

Moodera, J S, et al, The Phenomena of Spin-Filter Tunnelling, J Phys: Condens Matter 19 (2007) 24 pp.

Moyerman, S, et al, Magnetic structure variations during giant magnetoresistance training in spin valves with picoscale antiferromagnetic layers, J Appl Phys 99, 08R505 (2006),3 pp.

Mukai, T, et al, High-Performance and Damage-Free Magnetic Film Etching Using Pulse-Time-Modulated Cl2 Plasma, Jpn J Appl Phys , vol. 45, No. 6B (2006), pp. 5542-5544.

Munakata, M, et al, Concentration Dependence on Anisotropy Field of CoFeB Thin Film for Gigahertz Frequency Use, IEEE Transactions on Magnetics, vol. 41, No. 10, Oct. 2005, pp. 3262-3264.

Myers, E B, Current-Induced Switching of Domains in Magnetic Multilayer Devices, Science, vol. 285, Aug. 6, 1999, pp. 867-870.

Myers, E B, et al, Interplay of Spin-Transfer Torques and Thermal Activation in Nanomagnet Reversal, Cornell University, 14 pp.

Myers, E B, et al, Thermally Activated Magnetic Reversal Induced by a Spin-Polarized Current, Physical Review Letters, vol. 89, No. 19, Nov. 4, 2002,4 pp.

Nguyen, V H, et al, Hybrid CMP process for copper and ultra low-k materials integration, 2 pp.

Nitta, J, et al, Electrical Manipulation of Spin Precession in an INGAAS-Based 2DEG Due to the Rashba Spin-Orbit Interaction, IEEE Trans on Electron Devices, vol. 54 , No. 5, May 2007, pp. 955-960.

Nogi, Y, et al, Preparation and magnetotransport properties of MgO-barrier-based magnetic double tunnel junctions including nonmagnetic nanoparticles, J Phys D: Appl Phys 40 )2007) pp. 1242-1246.

Nowosielski, R, et al, Crystallization Kinetics of an Amorphous CO77Sl11 5B11 5 Alloy, Jamme, Jul.-Aug. 2006 vol. 17, Issue 1-2, pp. 121-124.

(56) References Cited

OTHER PUBLICATIONS

Nozieres, J P, Magnetic Random Access Memories (M-RAM): A truly universal memory?, Spintec, 8 pp.
Ochiai, T, et al, Distinctive Current-Induced Magnetization Switching in a Current-Perpendicular-To-Plane Giant_Magnetoresistance Nanopillar With a Synthetic Antiferromagnet Nanopillar With a Synthetic Antiferromagnet Free Layer, Appl Phys Lett 86,242506 (2005), 3 pp.
Ohldag, H, et al, Interfacial Moments in CofNiO Origins of AntiferromagneticfFerromagnetic Coupling, 1 large page.
Ohno, H, et al, Electrical Manipulation of Domain Walls in Ferromagnetic Semiconductors, Croucher Advanced Study Institute—Science and Applications of Spin Electronics, The University of Hong Kong, Aug. 15-20, 2005, 23 pp.
Ohsawa, Y, Magnetoresistance and Current-Driven Resistance Change Measurements in NiFe Film With a Nanoconstriction, IEEE Transactions on Magnetics, vol. 42, No. 10, Oct. 2006, pp. 2615-2617.
Onai, T, et al, Outlook for Advanced Semiconductor Process and Manufacturing Technologies, Hitachi Review, vol. 52 (2003) No. 3, pp. 117-124.
Ozatay, 0, et al, Spin transfer by nonuniform current injection into a nanomagnet, Applied Physics Letters 88, 202502 (2006), 3 pp.
Padhan, P, et al, Frequency-Dependent Magnetoresistance and Magnetocapacitance Properties of Magnetic Tunnel Junctions With MGO Tunnel Barrier, Appl Phys Lett 90, 142105 (2007) 3 pp.
Pareek, T P, Spin-orbit-induced torque in a collinear spin valve: A possible route to design fast magnetic memory, Physical Review B 75, 115308 (2007), 6 pp.
Park, C, et al, Annealing Effects on Structural and Transport Properties of RF-Sputtered COFEB/MGO/COFEB Magnetic Tunnel Junctions, J Applied Physics 99, 08A901 (2006), pp. 2639-2641.
Park, C, et al, Effect of Adjacent Layers on Crystallization and Magnetoresistance in CoFeB/MgO/CoFeB Magnetic Tunnel Junction, IEEE Transactions on MagnetiCS, vol. 42, No. 10, Oct. 2006, pp. 2639-2641.
Park, I H, et al, Nanometer-Sized Etching of Magnetic Tunnel Junction Stack for Magnetic Random Access Memory, Journal of Magnetism and Magnetic Materials 304 (2006), pp. C264-C266.
Parkin, S, et al, Giant tunnelling magnetoresistance at room temperature with MgO (100) tunnel barriers, Nature Materials, vol. 3, Dec. 2004, pp. 862-867.
Parkin, S, Magnetic Race-Track Memory: Current Induced Domain Wall Motionl, IBM Research, 2006, 60 pp.
Parkin, S, The Spin on Electronics!, Jan. 29, 2008, 1 p.
Pearton, S J, et al, Dry Etching of MRAM Structures, Mat Res Soc Symp Proc , vol. 614, 2000, 11 pp.
Pearton, S J, et al, ZnO Doped With Transition Metal Ions, IEEE Trans on Electron Devices, vol. 54, No. 5, May 2007, pp. 1040-1048.
Peng, Y, et al, Characterization of Interfacial Reactions in Magnetite Tunnel Junctions With Transmission Electron Microscopy, J Appl Phys , vol. 95, No. 11, pp. Jun. 1, 2004, 6798-6800.
Perdue, K L, et al, Exchange Bias and Giant Magnetoresistance in Spin Valves with Angstrom-Scale Antiferromagnetic Layers at 5 K, Harvey Mudd College, Apr. 29, 2005, 40 pp.
Persson, J, et al, Phase-Locked Spin Torque Oscillators: Impact of Device Variability and Time Delay, J Appl Phys 101, 09A503 (2007), 3 pp.
Petersen, C L, The Four-Point ProbeThesis at the Technical University of Denmark, Feb. 1999, 110 pp.
Petukhov, A G, et al, 100% Spin Accumulation in Non-Half-Metallic Ferromagnet-Semiconductor Junctions, J Phys : Condens Matter 19 (2007) 315205,16 pp.
Pribiag, V S, et al, Magnetic vortex oscillator driven by d c spin-polarized current, Nature Physics, vol. 3, Jul. 2007, pp. 498-503.
Pufall, M R, et al, Low-Field Current-Hysteretic Oscillations in Spin-Transfer Nanocontacts, Physical Review B 75, 140404 (R) (2007), 4 pp.
Rack, P D, Plasma Etching Outline, Univ of Tennessee, 34 pp.

Ricci, A, Dry Etch Process Application Note, Pall Microelectronics ABG-106-0405, 6 pp.
Rippard, W H, et al, Injection Locking and Phase Control of Spin Transfer Nano-oscillators, PRL 95,Aug. 5, 2005,4 pp.
Rippard, W H, et al, Quantitative Studies of Spin-Momentum-Transfer-Induced Excitations in Co/Cu Multilayer Films Using Point-Contact Spectroscopy, Appl Phys Lett , vol. 82, No. 8, Feb. 24, 2003, pp. 1260-1262 0.
Rippard, W H, et al, Spin-Transfer Induced Dynamics in Magnetic Nanostructures, NIST nanomagntodynamics and DARPA SpinS program, 29 pp.
Rivkin, K, et al, Switching Spin Valves Using R F Currents, 15 pp.
Rohrmann, H, Multilayer and Granular Films on Nanospheres, International Storage Technology Symposium, Jun. 18-21, 2007,41 pp.
Rosen, H, Nano-Bio-Magnetic Horizons, International Storage Technology Symposium, Jun. 18-21, 2007,14 pp.
Rossel, C, et al, Electrical current distribution across a metal-insulator-metal structure during bistable switching, J Appl Phys , vol. 90, No. 6, Sep. 15, 2001, pp. 2892-2898.
Rottmayer, R E, et al, Heat-Assisted Magnetic Recording, IEEE Transactions on Magnetics, vol. 42, No. 10, Oct. 2006, pp. 2417-2421.
Roy, A G, et al, Effect of seed layers in improving the crystallographic texture of CoCrPt perpendicular recording media, J Appl Phys , vol. 91, No. 10, May 15, 2002, pp. 8076-8078.
Ruzic, D, Highlights in Plasma Science From Around the World, Plasma Material Interaction Group, Univ of Illinois, Sep. 2006,55 pp.
Saitoh, E, et al, Current-induced resonance and mass determination of a single magnetic domain wall, Nature, vol. 431, Nov. 11, 2004, pp. 203-206.
Salinas, D, et al, Effects of Spin-Orbit Interactions on Tunneling Via Discrete Energy Levels in Metal Nanoparticles, Physical Review B, vol. 60, No. 8, Aug. 15, 1999, pp. 6137-6145.
Salinas, D, et al, Spin-Polarized Transport in II-VI Magnetic Resonant-Tunneling Devices, IEEE Trans on Electron Devices, vol. 54, No. 5, May 2007, pp. 984-990.
Sankey, J C, et al, Mechanisms Limiting the Coherence Time of Spontaneous Magnetic Oscillations Driven by DC Spin-Polarized Currents, Physical Review B 72, 224427 (2005) 5 pp.
Schrefl, I, et al, Micromagnetic Simulations and Applications, Vienna University of Technology, 5 pp.
Seki, T, et al, Spin-Polarized Current-Induced Magnetization Reversal in Perpendicularly Magnetized L 10-FEPT Layers, App Phys Lett 88 (2006), 3 pp.
Seneor, P, et al, Nanospintronics: when spintronics meets single electron physics, J Phys: Condens Matter 19 (2007) 22 pp.
Seo, S-M, et al, Effect of Shape Anisotropy on Threshold Current Density for Current-Induced Domain Wall Motion, Appl Phys Lett 90, 252508 (2007), 3 pp.
Serpico, C, et al, Power spectrum of current-induced magnetization dynamics in uniaxial nanomagnets, J Appl Phys 101, 09A507 (2007), 3 pp.
Serpico, C, et al, Thermal Stability in Uniaxial Nanomagnets Driven by Spin-Polarized Currents, IEEE Transactions on Magnetics, vol. 42, No. 10, Oct. 2006, pp. 2679-2681.
Sharma, M, et al, Inversion of Spin Polarization and Tunneling Magnetoresistance in Spin-Dependent Tunneling Junctions, Physical Review Letters, vol. 82, No. 3, Jan. 18, 1999, pp. 616-619.
Shen, W, et al, Effect of Film Roughness in MGO-Based Magnetic Tunnel Junctions, Appl Phys Lett 88, 182508 (2006) 3 pp.
Shen, WK, et al, In situ epitaxial growth of ordered Fept (001) films with ultra small and uniform grain size using a RuAl underlayer, J Appl Phys 97 (2005), 3 pp.
Shibata, J, et al, Current-Induced Magnetic Vortex Motion by Spin-Transfer Torque, Physical Review B 73, 020403{R) (2006), 4 pp.
Shibata, J, et al, Magnetic Vortex Dynamics Induced by Spin-Transfer Torque, 1 p.
Shimazawa, K, et al, Enhanced GMR Ratio of Dual Spin Valve With Monolayer Pinned Structure, IEEE Transactions on Magnetics, vol. 42, No. 2, Feb. 2006, pp. 120-125.
Shimomura, N, et al, Switching Current Fluctuation and Repeatability for MRAM With Propeller-Shape MT J, IEEE Transactions on Magnetics, vol. 42, No. 10, Oct. 2006, pp. 2757-2759.

(56) References Cited

OTHER PUBLICATIONS

Shin, B, et al, Etch Characteristics of COFESIB Magnetic Films Using Inductively Coupled Plasma Reactive Ion Etching for Magnetic Random Access Memory, Integrated Ferroelectrics 78, 2006 pp. 223-243.
Shin, C, et al, Growth, surface morphology, and electrical resistivity of fully strained substoichiometric epitaxial TiNx (0 67<J<1 0) layers on MgO(001), J Appl Phys , vol. 95, No. 1, Jan. 1, 2004, pp. 356-362.
Sinclair, A, et al, Scaling and Power Properties of Thermally Written MRAM, Abstract, NVE Corporation, 1 p.
Slaughter, J, et al, MRAM Technology: Status and Future Challenges, Cornell CNS Nanotechnology Symposium, May 14, 2004, 45 pp.
Slonczewski, J C, Conductance and Exchange Coupling of Two Ferromagnets Separated by a Tunneling Barrier, Phys Rev B, vol. 39, No. 10, Apr. 1, 1989, pp. 6995-7002.
Slonczewski, J C, Current-driven excitation of magnetic multi layers, journal, Dec. 19, 1995, 7 pages, Journal of Magnetism and Magnetic Materials 159.
Slonczewski, J C, Current-Driven Excitation of Magnetic Multilayers, Journal of Magnetism and Magnetic Materials 159 (1996), pp. L1-L7.
Slonczewski, J C, et al, Theory of voltage-driven current and torque in magnetic tunnel junctions, Journal of Magnetism and Magnetic Materials 310 (2007) 169-175.
Sossmeier, KD, et al, Comparison Between AC and DC Current Annealing in COFESIB Glass-Covered Amorphouse Microwires, J Phys D: Appl Phys 40 (2007) 3233-3238.
Sousa, RC, et al, Tunneling hot spots and heating in magnetic tunnel junctions, J Appl Phys , vol. 95, No. 11, Jun. 1, 2004, pp. 6783-6785.
Stiles, M D, et al, Adiabatic Domain Wall Motion and Landau-Lifshitz Damping, May 31, 2007 6 pp.
Stiles, M D, et al, Phenomenological Theory of Current-Induced Magnetization Precession, 16 pp.
Stiles, M D, et al, Spin Transfer Torque and Dynamics, 85 pp.
Stine, B E, et al, The Physical and Electrical Effects of Metal-Fill Patterning Practices for Oxide Chemical-Mechanical Polishing Processes, IEEE Transactions on Magnetics, vol. 45, No. 3, Mar. 1998, pp. 665-679.
Stohr, J, et al, Magnetization Manipulation in Nanostructures by Spin Currents, NSF, Div of Condensed Matter Physics & U S Dept of Energy, 14 pp.
Stohr, J, Probing the Ultrafast Magnetic Nanoworld with X-Rays, Stanford Synchrotron Radiation Laboratory, Stanford University, 43 pp.
Stohr, J, Soft X-Ray Science—From Photon Drought to Free Electron Lasers, Stanford Synchrotron Radiation Laboratory, 30 pp.
Stohr, J, The Magic of Magnetism: From Physical Attraction to Spin Doctors, Stanford Synchrotron Radiation Laboratory, Stanford Linear Accelerator Center, 45 pp.
Stokbro, K, Nanoelectronics Modeling Platform, Atomisitx Inc , 12 pp.
Sun, C J, et al, Epitaxial L 10 Fept magnetic thin films sputtered on Cu (001); Applied Physics Letters; vol. 82, No. 12; Mar. 24, 2003.
Sun, J I, Spin Angular Momentum Transfer in Current-prpendicular Nanomagnetic Junctions, IBM J Res & Dev , vol. 50, No. 1, Jan. 2006, pp. 81-100.
Svedberg, E B, Diffusion in C090Fe10/Ru multilayers, J Appl Phys, vol. 94, No. 2, Jul. 15, 2003, pp. 993-1000.
Svedberg, E B, et al, Interdiffusion in COFE/Cu Multilayers and Its Application to Spin-Valve Structures for Data Storage, J Appl Phys , vol. 94, No. 2, Jul. 15, 2003, pp. 1001-1006.
Takahashi, S, et al, Ion-Beam-Etched Profile Control of MT J Cells for Improving the Switching Characteristics of High-Density MRAM, IEEE Transactions on Magnetics, vol. 42, No. 10, Oct. 2006, pp. 2745-2747.
Tanaka, M, et al, MOS-Based Spin Devices for Reconfigurable Logic, IEEE Trans on Electron Devices, vol. 54 , No. 5, May 2007, pp. 961-976.

Tehrani, S, Magnetoresistive RAM, Freescale Semiconductor, Jul. 17, 2007, 27 pp.
Tehrani, S, et al, Progress and Outlook for MRAM Technology, IEEE Transactions on Magnetics, vol. 35, No. 5, Sep. 1999, pp. 2814-2819.
Theodonis, I, Spin Transfer Torque (STT) in Magnetic Tunnel Junctions, International Storage Technology Symposium, Jun. 18-21, 2007, 21 pp.
Thiaville, A, et al, Micromagnetic Understanding of Current-Driven Domain Wall Motion in Patterned Nanowires, Europhys Lett 69 (6), Mar. 15, 2005, pp. 990-996.
Thomas, L, et al, Oscillatory dependence of current-driven magnetic domain wall motion on current pulse length, Nature, vol. 443/14, Sep. 2006, pp. 197-200.
Tinkham, M, et al, Tunneling Through Metallic Quantum Dots, J of Low Temperature Physics, vol. 118, Nos. 5/6, 2000, pp. 271-285.
Tiusan, C, et al, Spin tunnelling phenomena in single-crystal magnetic tunnel junction systems, J Phys: Condens Matter 19 (2007) 35 pp.
Tondra, M, et al, High Temperature Pinning Properties of IRMN Vs FEMN in Spin Valves, J Vacuum Science and Technology, Jul./Aug. 1999, 15 pp.
Trachenko, K, et al, How the nature of the chemical bond governs resistance to amorphization by radiation damage, Physical Review B 71, 184104 (2005) 5 pp.
Tsoi, M, et al, Excitation of a Magnetic Multilayer by an Electric Current, PRL, vol. 80, No. 19, May 11, 1998, pp. 4281-4284.
Tsoi, M, et al, Magnetic domain wall motion triggered by an electric current, App Phys Letters, vol. 83, No. 13, Sep. 29, 2003,2617-2619.
Tsuji, K, et al, 0.1 um-Rule MRAM Development Using Double-Layered Hard Mask, IEEE, IEDM 01-799-802.
Tsunekawa, K, et al, Huge Magnetoresistance and Low Junction Resistance in Magnetic Tunnel Junctions With Crystalline MgO Barrier, IEEE Transactions on Magnetics, vol. 42, No. 2, Feb. 2006, pp. 103-107.
Tsunekawa, K, et al, Structural and Electrical Properties of (COXFE1 00-X)81 B19/MGO/(COXFE100-X)81 B19 Magnetic Tunnel Junctions, HA-01 Intermag, May 12, 2006,15 pp.
Urban, R, et al, Gilbert Damping in Single and Multilayer Ultrathin Films: Role of Interfaces in Nonlocal Spin Dynamics, PRB, vol. 87, No. 21,4 pp.
Van Roy, W, et al, Spin Injection and Detection in Semiconductors—Electrical Issues and Device Aspects, IEEE Trans on Electron Devices, vol. 54 , No. 5, May 2007, pp. 933-944.
Vanhaverbeke, A, et al, Simple model of current-induced spin torque in domain walls, Physical Review B 75, 024411 (2007), 5 pp.
Vanhaverbeke, A, et al, Transverse Domain Wall Propagated by Spin-Polarized Current, IBM Research, Zurich Research Laboratory, 1 p.
Varga, E, Domain wall motion in permalloy wires, 12 pp.
Vedyayev, A, et al, Resonant Spin-Torque in Double Barrier Magnetic Tunnel Junctions, Physics Letters A 355 (2006), pp. 243-246.
Vernier, N, et al, Domain wall propagation in magnetic nanowires by spin polarized current Injection, 17 pp.
Victora, R H, et al, Composite Media for Perpendicular Magnetic Recording, IEEE Transactions on Magnetics, vol. 41, No. 2, Feb. 2005, pp. 537-542.
Volkert, C A, et al, Focused Ion Beam Microscopy and Micromachining, MRS Bulletin, vol. 32, May 2007, pp. 389-400.
Waintal, X, et al, Current Induced Distortion of a Magnetic Domain Wall, May 9, 2007,5 pp.
Waintal, X, et al, Role of spin-dependent interface scattering in generating current-induced torques in magnetic multilayers, Physical Review B, vol. 62, No. 18, Nov. 1, 2000, pp. 12317-12327.
Wallace, R M, New Devices and Materials for 32nm and Beyond, Semicon West 2007,15 pp.
Wang, D, et al, Magnetostriction Effect of Amorphous CoFeB Thin Films and Application in Spin Dependent Tunnel Junctions, NVE Corporation, 2004, pp. 1-14.
Wang, D, et al, Spin Dependent Tunneling Junctions With Reduced Neel Coupling, J Appl Phys , vol. 93, No. 10, Parts 2 & 3, May 15, 2003, pp. 8558-8560.
Wang, J, et al, Spin Transfer in Magnetic Nano Devices with Perpendicular Anisotropy, University of Minnesota, 2006 APS A-22 00011, 14 pp.

(56) References Cited

OTHER PUBLICATIONS

Wang, J-P, et al, Composite Media (Dynamic Tilted Media) for Magnetic Recording, App Phys Lett 86 (2005), 3 pp.
Wei, Z, et al, Changing Exchange Bias in Spin Valves with an Electric Current, PRL 98,116603 (2007), 4 pp.
Wei, Z, et al, Spin Transfer in an Antiferromagnet, 5 pp.
Wetzels, W, Interaction effects in spin-valve structures, Casimir PhD Series, Delfl-Leiden, Mar. 2007, 117 pp.
White, R M, et al, Spin Transfer Stimulated Noise in Magnetic Recording Heads, Data Storage Systems Center, 41 pp.
Wierman, K W, et al, RuxCr1-xlTa underlayer for Co-alloy perpendicular magnetic recording, J Appl Phys, vol. 91, No. 10, May 15, 2002, pp. 8031-8033.
Wiese, N, et al, Antiferromagnetically Coupled Cofeb/Ru/Cofeb Trilayers, ARXIV:Cond-Matl0509749V1, Sep. 28, 2005, 3 pp.
Wijekoon, K, et al, Minimization of Metal Loss during Chemical Mechanical Planerization of Copper-Oxide and Copper-Low k Damascene Structures, CMP-MIC Mar. 2002, 4 pp.
Wolf, P J, Overview of Dual Damascene Cuflow-K Interconnect, International Sematech, Aug. 14, 2003,21 pp.
Wolf, S A, Spintronics—A retrospective and perspective, IBM J Res & Dev, vol. 50, No. 1, Jan. 2006, pp. 101-110.
Wong, D F, et al, Magnetic Mesa Structures Fabricated by Reactive Ion Etching With Co/NH3FXE Plasma Chemistry for an All-Silicon Quantum Computer, Nanotechnology 16 (2005), pp. 990-994.
Wong, P-K, et al, Reliability of Tunneling Magnetoresistance Recording Head—Lifetime, Failure Mode, and Production Screening, IEEE Transactions on Magnetics, vol. 42, No. 2, Feb. 2006, pp. 232-236.
Wood, R, et al, From Rotating-To Solid-State-To 3D-Storage?, Brainstorming the Future, International Storage Technology Symposium, Jun. 18-21, 2007,6 pp.
Worledge, D C, Single-domain model for toggle MRAM, IBM J Res & Dev, vol. 50, No. 1, Jan. 2006, pp. 69-79.
Wurz, M C, et al, Fabrication of a Micro Coil for Magnetooptical Data Storage, IEEE Transactions on Magnetics, vol. 42, No. 10, Oct. 2006, pp. 2468-2470.
Xi, H, et al, Spin waves excited by dc currents injected into single ferromagnetic thin films, Phys Rev B 75,174411 (2007), 8 pp.
Xiao, J, et al, Macrospin Models of Spin Transfer Dynamics, Phys Rev B 72,014446 (2005), 13 pp.
Xiao, J, et al, Spin-transfer torque for continuously variable magnetization, Phys Rev B 73,054428 (2006) 10 pp.
Xu, Y, et al, In Situ Ordering of FEPT Thin Films With Face-Centered-Tetragonal (001) Texture on CR100-XRUX Underlayer At Low Substrate Temperature, App Phys Lett, vol. 80, No. 18, May 6, 2002, pp. 3325-3327.
Yagami, K, et al, Low-current spin-transfer switching and its thermal durability in a low-saturation-magnetization nanomagnet, App Phys Lett, vol. 85, No. 23, Dec. 6, 2004, pp. 5634-5636.
Yamaguchi, A, et al, Reduction of Threshold Current Density for Current-Driven Domain Wall Motion by Shape Control, 16 pp.
Yang, S, et al, Spin-transfer-torque-driven domain-wall dynamics in Permalloy nanowires, Physical Review B 75, 220403(R) (2007), 4 pp.
Yang, T, et al, Current-Induced Vortex-Vortex Switching in a Nanopillar Comprising Two Co Nano-Rings, Appl Phys Lett 90, 092505 (2007), 3 pp.
Yang, T, et al, Estimation of local and nonlocal contributions to the current-induced magnetization switching, Phys Rev B 74,153301 (2006),4 pp.
Yang, T, et al, Influence of Capping Layer on the Current-Induced Magnetization Switching in Magnetic Nanopillars, J Appl Phys 99, 073708 (2006), 5 pp.

Yoda, H, et al, 1.8 V Power Supply 16 Mb-MRAMs With 42 3% Array Efficiency, IEEE Transactions on Magnetics, vol. 42, No. 10, Oct. 2006, pp. 2724-2726.
Yuasa, S, et al, Characterization of Growth and Crystallization Processes in Cofebfmgofcofeb Magnetic Tunnel Junction Structure by Reflective High-Energy Electron Diffraction, Appl Phys Lett 87, 242503 (2005), 3 pp.
Yuasa, S, et al, Giant room-temperature magnetoresistance in single-crystal Fe/MgO/Fe magnetic tunnel junctions, Nature Materials, vol. 3, Dec. 2004, pp. 868-871.
Yung, R B, et al, Control of Chlorine Inductively Coupled Plasma Using Optical-Emission Spectroscopy, J Elec Mat, vol. 31, No. 10,2002, pp. 994-998.
Zhang, J, et al, Automated Process Control of Within-Wafer and Wafer-to-Wafer Uniformity in Oxide CMP, CMP-MIC Mar. 2002, 6 pp.
Zhang, S, Current Research in Current-Driven Magnetization Dynamics, University of Missour-Columbia, Feb. 14, 2006, 48 pp.
Zheng, Y K, et al, Spin Flop Switching of the Guided Synthetic Antiferromagnet MRAM, IEEE Transactions on Magnetics, vol. 42, No. 10, Oct. 2006, pp. 2742-2744.
Zhou, Y, et al, Intrinisic Phase Shift Between a Spin Torque Oscillator and an Alternating Current, J Appl Phys 101, 09A51 0 (2007), 3 pp.
Zhu, J, Microwave-assisted magnetic recording, International Storage Technology Symposium, Jun. 18-21, 2007, 35 pp.
Zhu, J-G, Pinholes and Spin Transfer Effect in Magnetic Tunnel Junction Heads, J Appl Phys 97 (2005), 3 pp.
Zhu, X, et al, Effect of Damping Constant on Magnetic Switching in Spin Torque Driven Perpendicular MRAM, IEEE Transactions on Magnetics, vol. 43, No. 6, Jun. 2007, 2349-2351.
Zhu, X, et al, Spin Torque and Field-Driven Perpendicular MRAM Designs Scalable to Multi-GB/Chip Capacity, IEEE Transactions on Magnetics, vol. 42, No. 10, Oct. 2006, pp. 2739-2741.
Abstracts, 52nd Magnetism and Magnetic Materials Conference, Nov. 2007, 143 pp.
An Introduction of Etch Process, Hynix, 69 pp.
Araswat, EE3111Cu Interconnect, Stanford University, 18 pp.
CMP Technology, 14 pp.
Cu Damascene Process, 6 pp.
Etching, Feb. 20, 2005, 110 pp.
FEI Company Product Data, VectraVision System, FIB System for Advanced Circuit Editing, 2003, 4 pp.
FEI Company, Tools for Nanotech, CoppeRx II for Mixed-Field FIB Deprocessing, 2006, 1 p.
ISSCC-2007: Hitachi/Tohuku Univ; Paper 026-5, 12 pp.
Lithography, Lecture 15 (Alignment and Exposure), Semiconductor Manufacturing Technology, Chapters 13-15, 71 pp.
Plasma Lab C.Y.C.U., 26 pp.
Reactive Ion Etching of Magnetic Materials, ISSCC-2007: HitachilTohuku Univ; Paper D26-5, 12 pp.
SPC-CIPTech (Ver 3) Technical Specifications (rev Jan. 2006), 4 pp.
SpinAps Agenda, Abstracts, Mar. 17-19, 2006.
SPM-CIPTech, Capres A/S, 1 p.
Technology Backgrounder: High-k gate oxides, IC Knowledge 2002,3 pp.
Technology Backgrounder: Immersion Lithography, IC Knowledge 2003,5 pp.
The Microscopic Twelve Point Probe, Capres A/S, 1 p.
Ultrafast Magnetic Switching of Nanoelements with Spin Currents, Spin Injection, 8 pp.
V600FIB System, The Most Efficient, Flexible and Cost-effective Device Modification Tool Available for Today's Semiconductor Lab, FEI Company Product Data 2006, 4 pp.

* cited by examiner

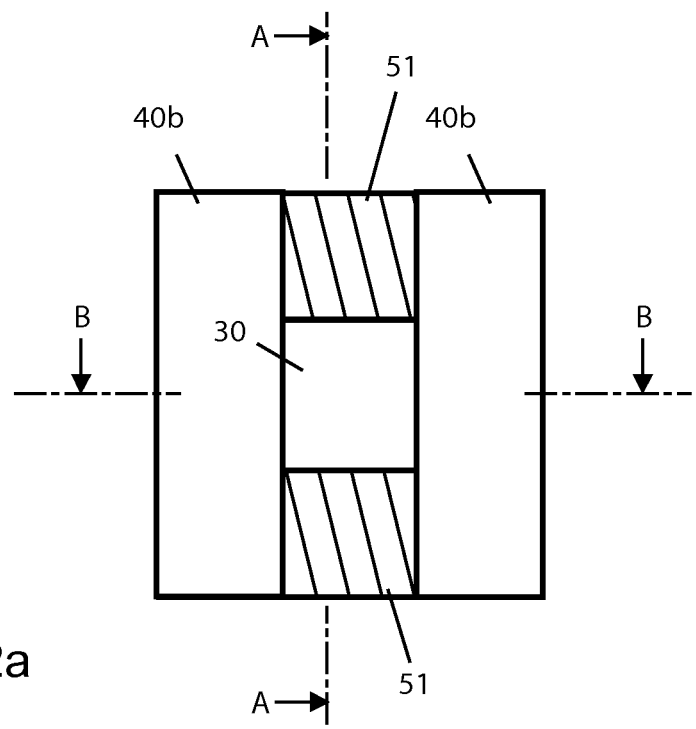
FIG. 22a
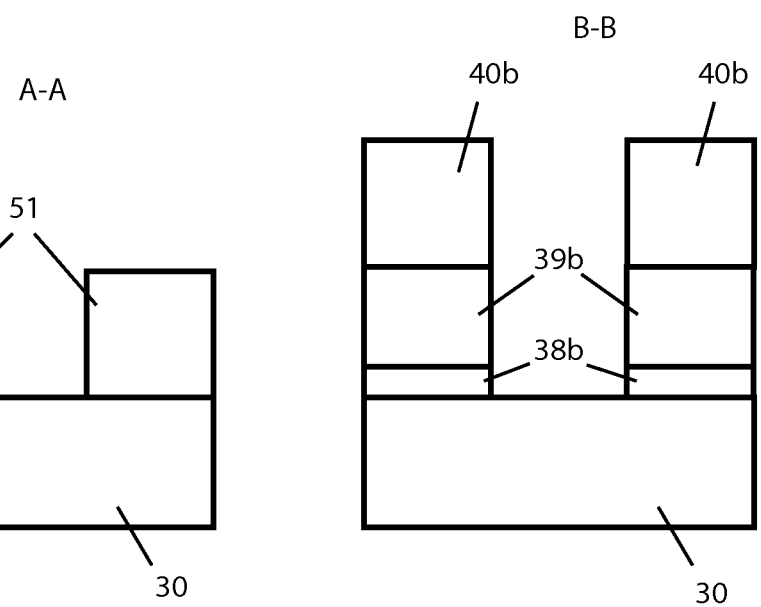
FIG. 22b
FIG. 22c

METHOD FOR MANUFACTURING HIGH DENSITY NON-VOLATILE MAGNETIC MEMORY

CROSS REFERENCE TO RELATED APPLICATIONS

This application is a continuation-in-part of commonly assigned U.S. patent application Ser. No. 12/040,827 filed Feb. 29, 2008 which issued as U.S. Pat. No. 8,535,952 on Sep. 17, 2013.

FIELD OF THE INVENTION

The present invention relates generally to non-volatile magnetic random access memory and particularly to methods of manufacturing memory cells for non-volatile magnetic random access memory (MRAM).

BACKGROUND

FIGS. 1 and 2 illustrate a selected stage of the prior art fabrication process of a non-volatile MRAM array on a wafer. The stack of thin film layers are deposited on a substrate containing CMOS circuitry (not shown) and landing pads for electrical connections to the bottom electrode (BE) for the magnetic tunnel junction (MTJ) elements. A typical magnetic tunnel junction (MTJ) cell consists of a bottom electrode (BE) and seed layers, followed by an anti-ferromagnetic pinning layer (AFM). The composition of AFM layer is typically alloys of IrMn or PtMn. A fixed magnetic layer is deposited on top of the AFM layer. The fixed magnetic layer typically has the structure of a synthetic anti-ferromagnetic layer with two ferromagnetic layers made from compounds of Co and Fe, separated by a very thin Ru layer to induce anti-ferromagnetic coupling between the two ferromagnetic sub layers. A tunnel barrier is deposited on top of the fixed layer. The composition of tunnel barrier layer is preferably MgO. The tunnel barrier separated the fixed layer from a free magnetic layer preferably made of magnetic materials of ferromagnetic elements Co, Fe, and Ni. Free layer may also contain up to 20 atomic % of B. The AFM layer, fixed magnetic layer, tunnel barrier layer, and free magnetic layer make up the important parts of the MTJ.

The fixed magnetic layer has a magnetic moment direction pinned into a single direction through exchange coupling to the adjacent AFM layer. The magnetic moment direction of the free magnetic layer can be changed between the parallel and anti-parallel direction with respect to the fixed magnetic layer. The tunnel barrier layer allows electrons to tunnel between the fixed magnetic layer and the free magnetic layer. When the free magnetic layer's magnetic moment is parallel with the fixed layer's magnetic moment, the resistance to electron flow through tunnel barrier layer is lower; and when the free layer's magnetic moment is anti-parallel with the fixed layer's magnetic moment, the resistance to electron flow through tunnel barrier layer is higher. This difference in resistance is also known as "tunnel magneto-resistance" or TMR.

On top of the MTJ/bottom electrode stack, a top electrode and dielectric layers are deposited. The dielectric layer functions as an etch mask during the patterning of the MTJ element and bottom electrode. Typically, the dielectric etch mask has the shape of a post or pillar. In conventional lithography, the control of the critical dimensions of the post shape is rather limited and hence strongly affects the size control of the final MTJ element. To alleviate this critical dimension control in two dimensions, a fabrication process involving two photolithography steps and two etch steps have been previously been proposed (U.S. Pat. No. 7,863,060 to Belen, et al. (Jan. 4, 2011)). However, the thickness of the dielectric layer in the prior art limits the resolution of the patterning process and introduces a large topography and gap to be filled prior to any subsequent patterning step. The current invention addresses this deficiency by using a very thin dielectric mask, as well as provide methods to reduce the size of the MTJ element and to self-align the bitlines to the MTJ elements.

SUMMARY OF THE INVENTION

Embodiments of the present invention include methods for manufacturing of a magnetic tunnel junction (MTJ) array on a wafer using double patterning to achieve dense arrays of MTJs exceeding the limit set by the minimum feature size (F) in every technology node. Two orthogonal line patterning steps achieve an array of MTJs located where the orthogonal lines overlap. In addition, a self-aligned double patterning method embodiment allows for a half pitch capability for the packing of the MTJs in the array. The self-aligned double patterning approach also allows for reducing one dimension of the MTJ to create MTJ with aspect ratio larger than one, while the largest dimension of the MTJ is limited by the feature size F and the size is smaller than a traditionally patterned MTJ with an aspect ratio larger than one, where the smallest dimension of the MTJ is limited by the feature size F. Since program current is proportional to area of barrier layer, it helps to reduce program current without any other layout change.

In one set of embodiments, which include the first detailed embodiment described below, a set of mask pads that self-define the location of the MTJ pillars are formed over bulk layers for the MTJ cells including the top electrode. The materials and thicknesses of the stack of layers that provide the masking function are selected so that after the initial set of mask pads have been patterned, a sequence of etching steps progressively transfers the mask pad shape through the layers in multiple mask layer and down through all of the MTJ cell layers to the form the complete MTJ pillars. The sequence of etching steps can progressively consume the upper layer in the mask pads but the selected sequence of layers provides that underlying layers with different etching resistant properties provide the mask for a particular phase. The initial mask pads are used in a sequence of etching steps that each form a subsequent mask pad from the multiple layers of material deposited above the top electrode and ultimately etch down to the substrate to form the MTJ pillars including the top electrode. An embodiment of set of layers for the sequence of mask pads includes a first (lower) dielectric layer, a thin metal layer, and a second (upper) dielectric layer. A planarizing BARC layer is also deposited above the upper dielectric layer as part of the patterning process.

The shape and location of the initial mask pads in the first group of embodiments are determined by first etching parallel lines in the upper dielectric layer and then forming pads of dielectric material by etching using a second line mask with parallel lines orthogonal to the first lines. In these embodiments the initial mask pads are the upper dielectric material disposed on the metal layer. The next etching step uses the initial mask pads as a mask to etch through the metal layer with the result being that a bilayer mask pad has been formed on the lower dielectric layer. The following etching step uses the bilayer mask pad to etched down through the lower dielectric layer. The upper dielectric pad layer is consumed in the process, so that the mask pads now have the metal layer as the upper layer over the lower dielectric layer. Next the top electrode layer is etched. The top metal layer in the pads is preferably a different metal than the top electrode to facilitate selective etching, but the lower dielectric pad layer function as a hard mask. Appropriate etching steps are then used to etch through the MTJ and bottom electrode layers to complete the formation of the MTJ cell pillars. Any remaining lower dielectric mask pad material can be removed by etching, then a conventional process can be employed to form the bitline interconnection for each MTJ cell.

The shape and size of the mask pads is determined by the overlapping area of two sets of separately patterned sets of mask lines. If each set of mask lines has a width equal to the feature size F then the pads will be have an aspect ratio of one. The theoretical square shape will become rounded by increased etching of the edges. In embodiments of the invention either or both sets of mask lines can be formed using the self-aligned double patterning (SDP) method described herein that allows for reduction of the mask line width and pitch to one half F. The embodiments using the SDP method reduce one or both in-plane dimensions of the MTJ pillar and may provide an important reduction in the current required to switch the free layer state without any other layout change other than the MTJ feature size. Reducing the program current required to switch the free layer state is one of the most serious design issues.

The self-aligned double patterning (SDP) method is used in various embodiments of the invention. For example, in the second detailed embodiment of the invention described below, the first set of parallel mask lines are formed using the SDP method and the second set of orthogonal mask lines can then be formed as described in the first embodiment. The SDP method forms a set sacrificial mask lines using conventional photo lithography, which are limited to feature size F. The sacrificial mask lines can be photoresist or material deposited using photoresist masks. After the sacrificial mask lines have been fabricated, a layer spacer material, which is a selected as a material that can survive etching of the sacrificial mask line material in subsequent processing, is deposited over the sacrificial mask lines and then partially etched to leave only wedge-shaped lines of spacer material at the sides of sacrificial mask lines. The sacrificial mask line material is removed to leave two lines of wedge-shaped spacer material for each sacrificial mask line. The lines of wedge-shaped spacer material spacer are then used as a mask to etch lines into the underlying layer in the stack of mask layers. In this way the first set of lines are formed with a density that is twice that of the photoresist lines and, therefore, exceed the limit set by the minimum feature size (F) of the photo lithography technology.

In another set of embodiments, which include the fourth, fifth and sixth detailed embodiment described below, a hard mask layer is deposited on the MTJ/BE stack before the set of three mask layers as described above is deposited. The top electrode layer is not included at this stage. The first set of mask lines is then formed as described above for the first embodiment and used as a mask to etch matching lines in the first (lower) dielectric layer. In turn these dielectric lines are used to etch matching lines in the hard mask layer. The hard mask lines are then used to etch lines in the MTJ/BE stack down to the substrate. In order to fill the spaces between the MTJ/BE lines, the MTJ/BE lines with the remaining hard mask layer in this embodiment are first covered with a thin conformal layer of SiN followed by a thicker SiO2 which is planarized. The top surfaces of the hard mask on the MTJ/BE lines are then exposed by planarization processes. A top electrode layer is then deposited over the wafer. The second set of orthogonal lines are then formed by a process that starts by depositing dielectric, metal, and BARC layers. A photoresist line mask is patterned and lines are etched from the dielectric layer disposed on the top electrode layer. Etching through the top electrode layer forms top electrode lines extending orthogonally to the MTJ/BE lines. The material that is not covered by the top electrode layer is removed to form of the MTJ/BE pillars. A conventional process can be resumed at this stage. Alternatives in this set of embodiments use the SDP method to form first and/or the set of mask lines.

BRIEF DESCRIPTION OF THE FIGURES

FIGS. 11-23e show cross sectional views of the thin films perpendicular to the substrate surface illustrate selected stages of a fabrication method according to an embodiment the invention in which the first set of mask lines are used to patterned the MTJ/BE lines before the top electrode layer is deposited.

DETAILED DESCRIPTION OF THE INVENTION

In the following description of the embodiments, reference is made to the accompanying drawings that form a part hereof, and in which is shown by way of illustration of the specific embodiments in which the invention may be practiced. It is to be understood that other embodiments may be utilized without departing from the scope of the present invention. It should be noted that the figures discussed herein are not drawn to scale and thicknesses of lines are not indicative of actual sizes. Unless otherwise noted the figures show cross sectional views of the thin films perpendicular to the substrate surface. Although only a small number of cells are shown in the figures, the method may used for the simultaneous fabrication of many cells on a wafer according to standard techniques.

Embodiments of the present invention include methods for manufacturing of a magnetic tunnel junction (MTJ) array on a wafer. In each of the embodiments a two-part patterning is performed in two orthogonal line patterning steps to achieve an array of square or rectangular MTJs. In addition, in various alternatives a self-aligned double patterning (SDP) method allows for a half pitch (F/2) capability in either or both in-plane dimensions for the packing of the MTJs in the array.

In a first set of embodiment that will be described in detail, the bulk layers for the MTJ cells including the top electrode layer are deposited. The magnetic moments of the fixed layers of the present invention are then set using a magnetic annealing process whereby the magnetic films are exposed to a magnetic field of 4-10 kOe, applied in-plane of the wafer surface, at a temperature usually over 350° C. In one embodiment of the present invention, a magnetic field of 10 kOe is applied, in-plane of the wafer surface, at 360° C. for 2 hours. In other embodiments of the present invention the field exposure time may be shorter, for as short as a few minutes, or longer. The annealing process causes re-crystallization of the free and fixed layers adjacent to the MgO tunnel barrier layer. This step is critical, as it ensures a high TMR, and impacts the read-speed of the final memory. Alternatively, the magnetic annealing step can also be performed after the whole back-end process has been completed.

Next, the set of mask layers, e.g. dielectric/metal/dielectric are deposited. The first line mask is used to first pattern lines in the upper dielectric, then the second orthogonal line mask is used to form pads of upper dielectric that will then be used to initiate the sequence of etching steps that ultimately transfer the pad shape down through all of the layers for the MTJ cell.

Figure 1:
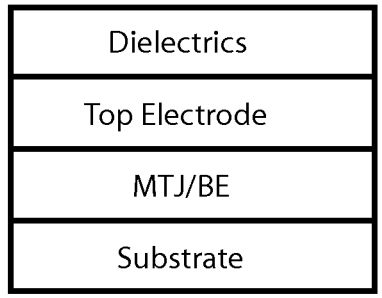
FIG. 1 is an illustration of a thin film layer stack for a prior art MRAM cell.
Figure 2:
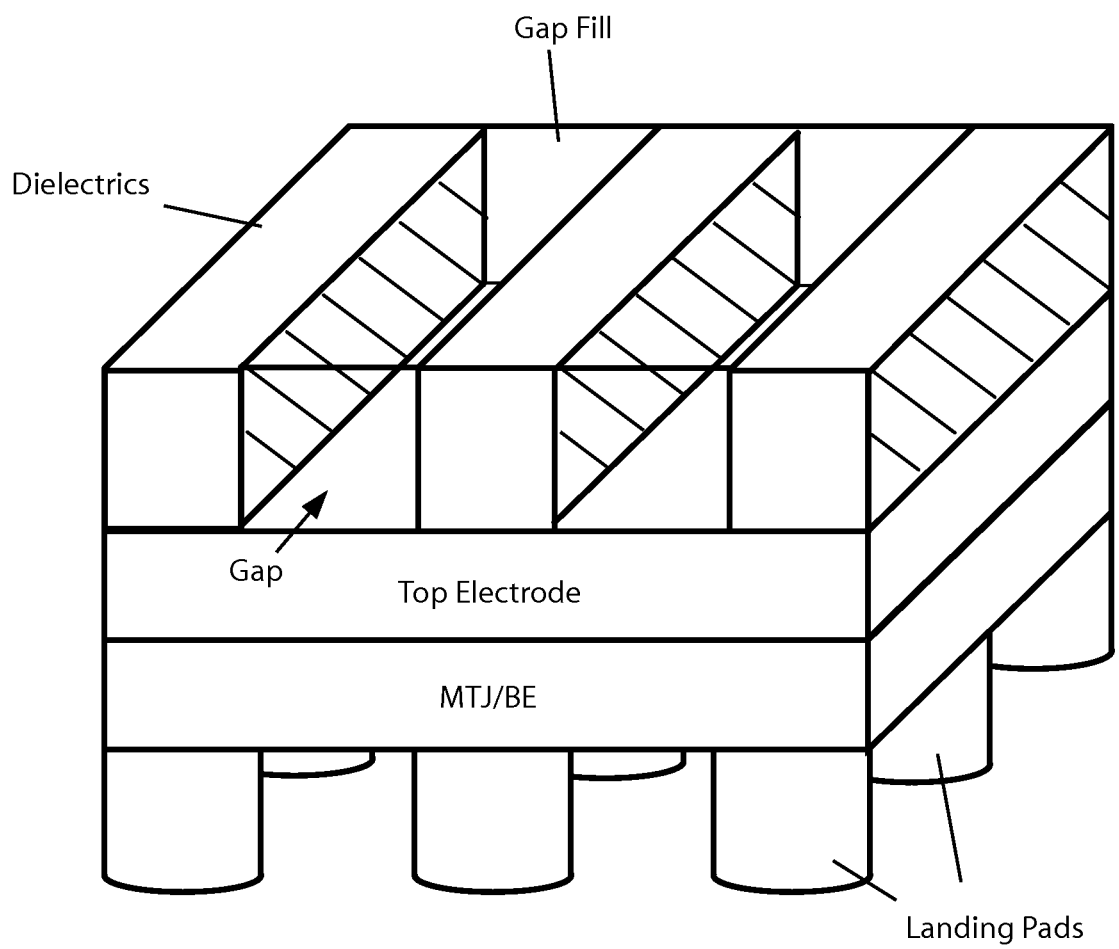
FIG. 2 is an illustration of a selected stage of a prior art fabrication process of an MRAM array on a wafer.
Figure 3:
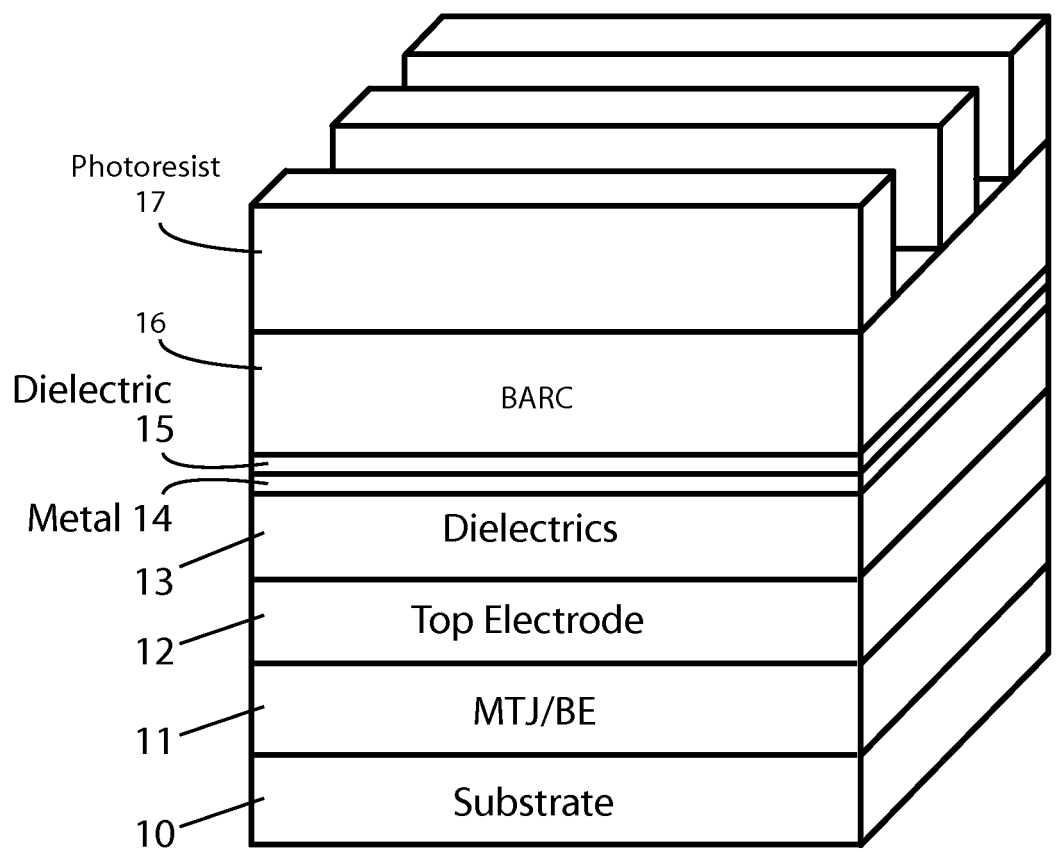
FIGS. 3-9 illustrate selected stages of a fabrication method according to a first embodiment the invention, showing cross sectional views of the thin films perpendicular to the substrate surface.

Referring to FIG. 3, on top of the MTJ and bottom electrode 11, a top electrode 12 and dielectric layers 13 are deposited. The lower dielectric layer 13 functions as an etch mask during the patterning of the MTJ element and bottom electrode 11. In turn, to pattern the dielectric layer 13, a thin metal layer 14 and a thin layer of (upper) dielectric material 15 are deposited. In a preferred embodiment described below the dielectric layers 13 and 15 are made of SiO2 or other oxide, or SiN or other nitride. In a preferred embodiment described below the thin metal layer 14 is made of Cu, or other material with good etch chemistry selectivity compared the oxide or nitride layer 13 and 15.

Figure 4:
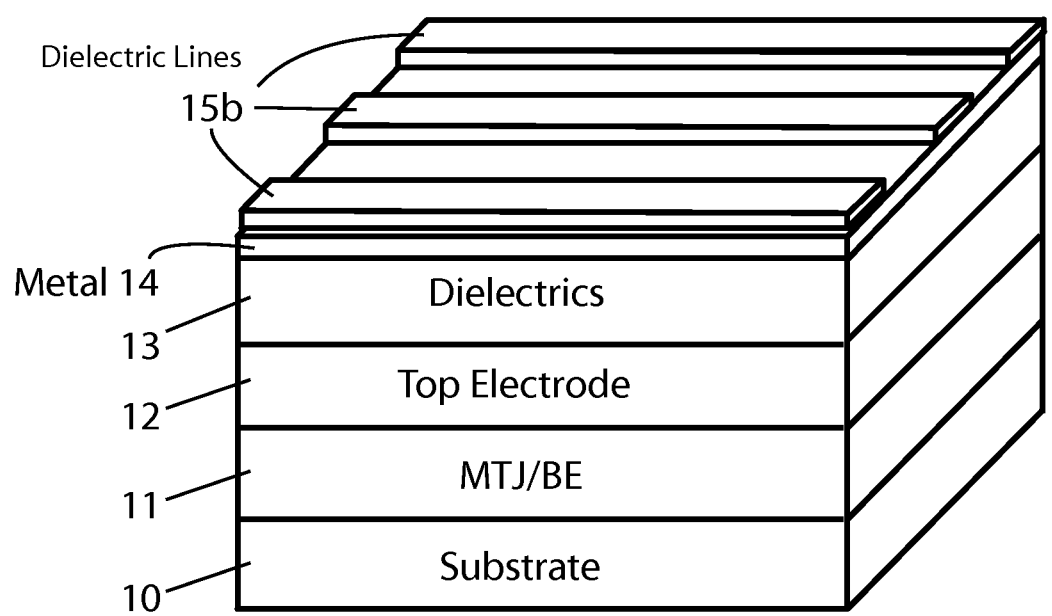

Referring now to FIG. 3, after the bulk layers for the MRAM and mask layers have been deposited an bottom anti-reflection coating (BARC) layer 16 is coated on top of the thin upper dielectric layer 15. Next, in this embodiment a photoresist mask 17 is patterned into lines extending over multiple cells on the wafer using conventional lithography. The line-patterned photoresist layer 17 is used as an etch mask for etching out a corresponding line pattern into the thin upper dielectric layer 15 to produce dielectric lines 15$b$ as shown in FIG. 4. The etch process uses the thin metal layer 14 as an etch stop. The dielectric lines 15$b$ now form a pattern mask on top of a thin metal layer 14. For example, this etching process may use $CF_4$, $Cl_2$, $BCl_3$ plasma or any combination of these with other gases such as Ar, $H_2$ or $O_2$, which has a low etch rate of the metal layer 14 compared to the dielectric layer 15. Next, any remaining photoresist layer 17 and BARC layer 16 are stripped away after the etching is complete.

Figure 5:
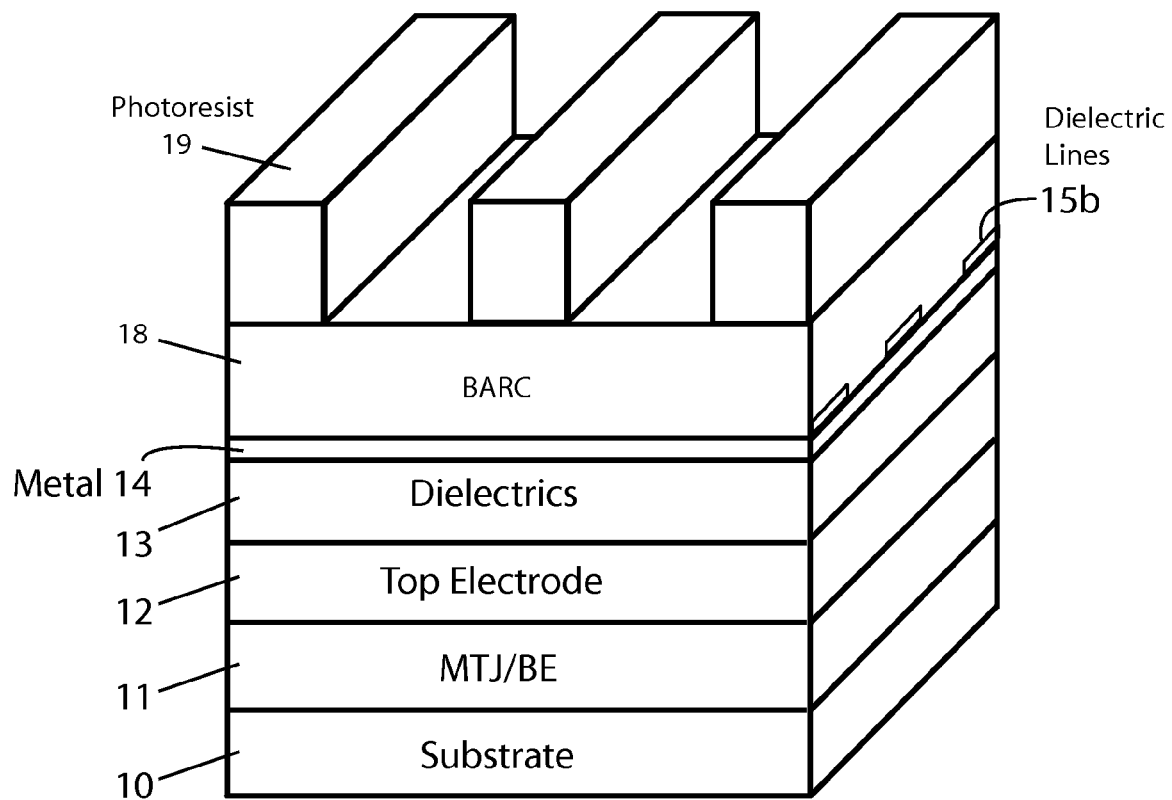

FIG. 5 illustrates a subsequent selected stage of the process after a planarizing BARC layer 18 is deposited over the thin dielectric lines 15$b$ shown in FIG. 4. This planarizing is possible since the dielectric lines 15$b$ are much thinner than the thickness of the BARC layer 18. For example, typical thickness of thin dielectric lines 15$b$ is less than 50 nm. Next, a second photoresist line mask 19 has been patterned on the BARC layer 18 in an orthogonal direction to the thin dielectric lines 15$b$ previously formed. The structures on the wafer as shown in FIG. 5 will now be subjected to a series of etching steps that selectively remove materials to ultimately produce square or rectangular pillars that include a top electrode over the MTJ/BE pads.

Figure 6:
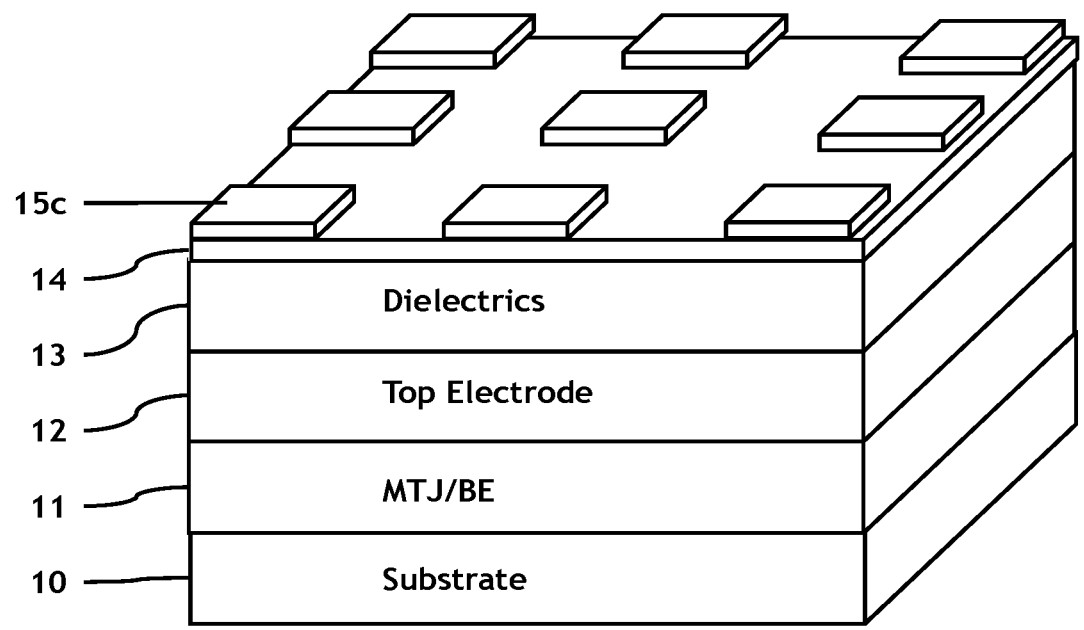

FIG. 6 illustrates a subsequent selected stage of the process after the structure shown in FIG. 5 has been etched down through the dielectric lines 15$b$ to form thin dielectric square or rectangular-shaped pads 15$c$ disposed on the surface of metal layer 14. These dielectric pads 15$c$ will be used as an etch mask in subsequent steps and define the shape and location of the MTJ pillars. The selected etching process removes the unmasked dielectric material and stops at the metal layer 14. The photoresist lines 19 and BARC layer 18 are stripped away after the etching is complete. For example, this etching process may use $CF_4$, $Cl_2$, $BCl_3$ plasma or any combination of these with other gases such as Ar, $H_2$ or $O_2$, which has a low etch rate of the metal layer 14 compared to the dielectric layer 15$b$.

Figure 7:
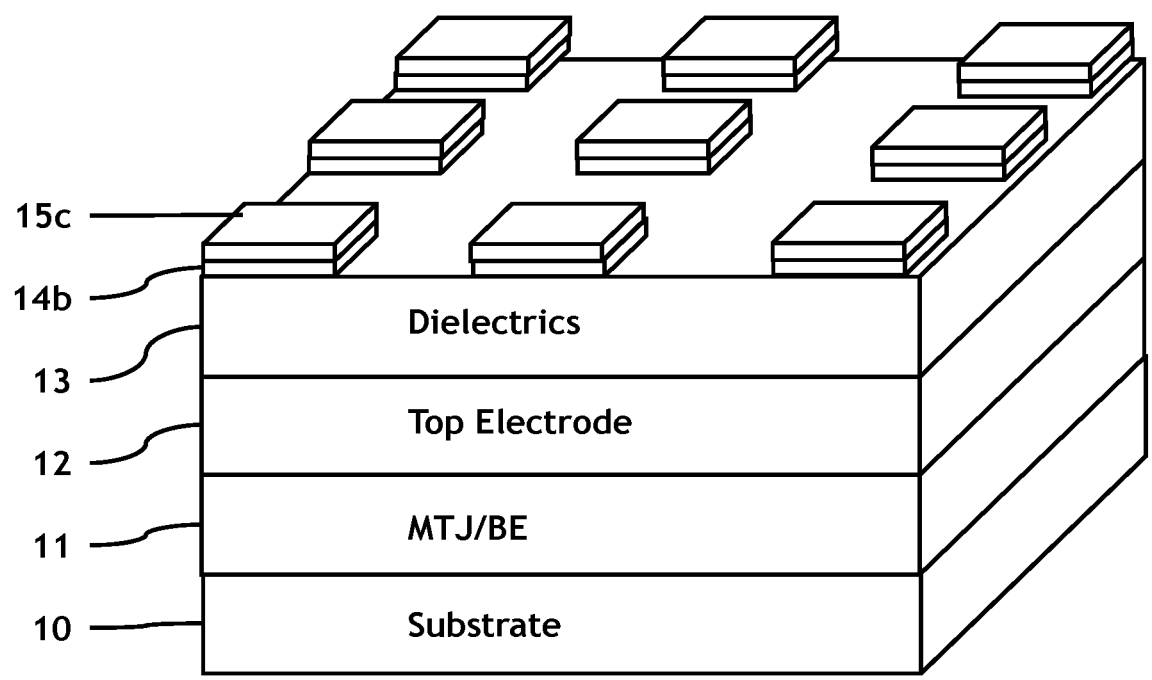

FIG. 7 illustrates a subsequent selected stage of the process after the structure shown in FIG. 6 has been etched down through the metal layer 14. For example, this etching process may use methanol plasma which has a high etch rate of the metal layer 14 compared to the dielectric layer 15$c$. The selected etching process for this phase removes the exposed metal in layer 14 while leaving the dielectric material in pads 15$c$. The dielectric pads 15$c$ have been used as an etch mask to transfer the square or rectangular pad shape into metal pads 14$b$ which are the masked areas of metal layer 14. The result at this stage is that dielectric layer 13 has an array of square or rectangular pads (in a top view) formed on its surface with each pad being formed from an upper layer 15$c$ of dielectric material and a lower layer 14$b$ of metal.

Figure 8:
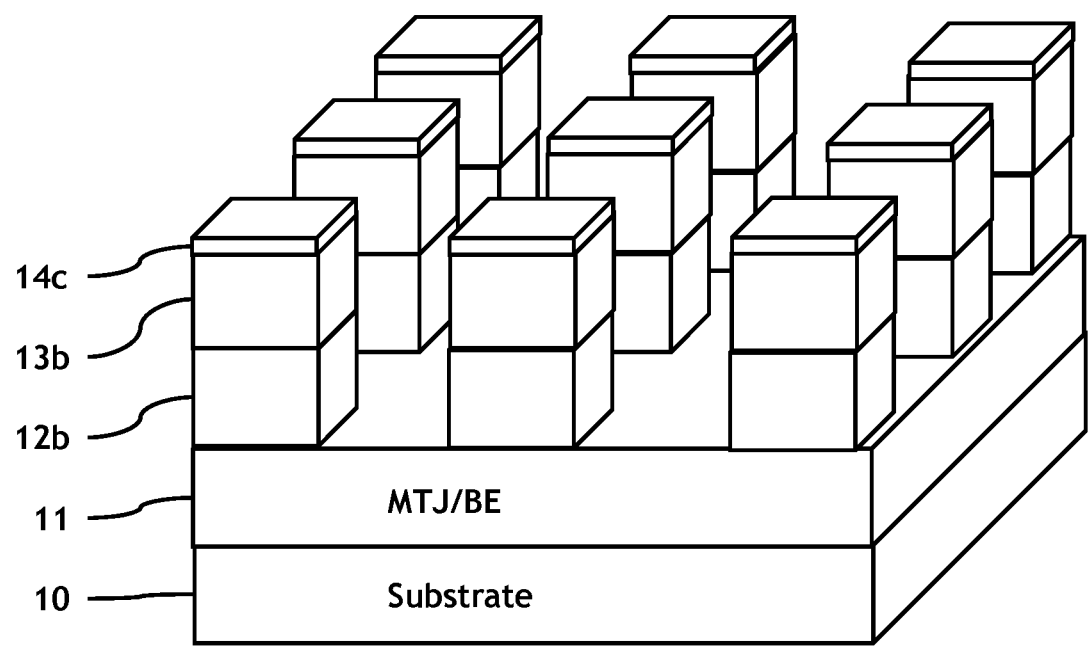

FIG. 8 illustrates a subsequent selected stage of the process after the structure shown in FIG. 7 has been etched down through the lower dielectric layer 13 and top electrode layer 12 using two separate etch steps. In the first of these etch steps, the upper dielectric pads 15$c$ have been consumed in the process of etching the lower dielectric layer 13. The metal pads 14$c$ are what remains of the initial pads 14$b$ which act as an etch mask to form lower dielectric hard mask pads 13$b$ from the bulk dielectric layer 13. In the second etching step, the hard mask pads 13$b$ act as the mask to etch out the top electrode layer 12. As noted the preferred material is copper (Cu) for the metal pads 14$c$. The metal for the top electrode should not be not Cu but should be Ta or similar metal. This etching step might consume the thin metal pads 14$c$ leaving bilayer pillar mask pads 12$b$, 13$b$ on top of the MTJ/bottom electrode layer stack 11. For example, the etching process to remove unmasked top electrode material may use methanol plasma which has a high etch rate of the top electrode layer material compared to the lower dielectric pads 13$b$.

Figure 9:
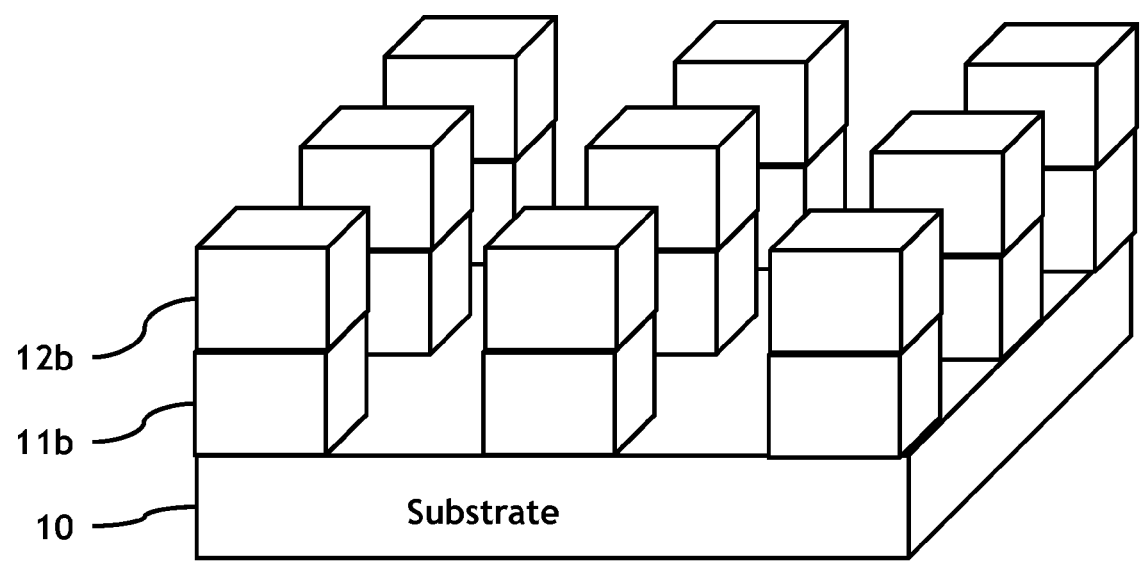

Referring now to FIG. 9, mask pads 13$b$ have been used to etch down through the MTJ/BE layer stack 11 to form MTJ/BE pillars 11$b$ with top electrode pads 12$b$ on top. Any remaining dielectric pad 13$b$ has been stripped off using appropriate etch chemistry. Although FIG. 9 shows square shaped pillars, the actual shape will be more rounded to have a cylindrical shape with circular or elliptical cross section due to inherent increased etching of the edges. From this stage once the MTJ/BE pillars 11$b$ have been patterned, a conventional bitline interconnection process can be resumed. Typically the array of MTJ/BE elements are encapsulated in dielectric material (not shown) and followed by means to make bitline electrical contact to the top electrode 12$b$ and providing electrical wiring to the CMOS circuitry in the substrate 10.

In a second embodiment of the present invention, which is an alternative embodiment related to the first embodiment, is illustrated in FIGS. 10$a$-$f$. This embodiment uses the self-aligned double patterning (SDP) method to create the first set of line patterns as described above. The first set of lines of dielectric material are created using a mask formed from spacer material that is initially deposited at the sides of a line mask made of a sacrificial layer 26. The sacrificial layer 26 can be made of photoresist, but can also be etched out of a sacrificial layer material using conventional photo lithography. In this way the first set of lines are formed with a density that is twice that of the photoresist lines. As shown in FIG. 10$a$, this embodiment begins with a stack of layers substrate 20, MTJ/BE 21, top electrode 22, first (lower) dielectric 23, thin metal 24, and second (lower) dielectric 25, which are similar to those described in the first embodiment. A sacrificial line mask 26 (shown in cross section) has been patterned using standard photo lithography and deposition. In this SDP embodiment the line width and spacing are both first patterned as equal to F followed by a trimming of the line width to one-half F (i.e. F/2). In FIG. 10b, a spacer material 27 has been conformally deposited on top of the sacrificial lines 26 to a thickness of F/2. The spacer material is selected to be selectively etchable from the material in the sacrificial lines 26. In FIG. 10c, a part of the spacer material 27 between the sacrificial lines 26 has been etched away leaving a roughly triangular or wedge-shaped spacer line 27b abutting each side of the sacrificial lines 26. The wedge-shaped spacer line 27b is approximately F/2 wide at the bottom.

Figure 10A:
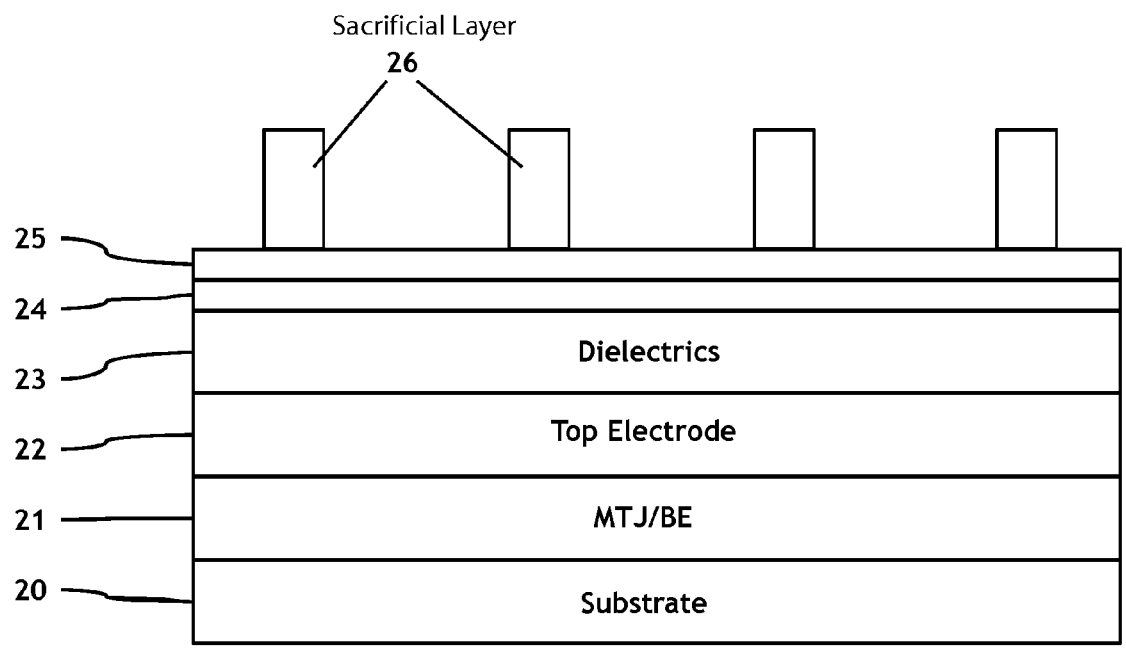
FIGS. 10a-f illustrate cross sectional views of the thin films perpendicular to the substrate surface at selected stages of a fabrication method according to an embodiment the invention using the self-aligned double patterning (SDP) method for the first set of mask lines.
Figure 10B:
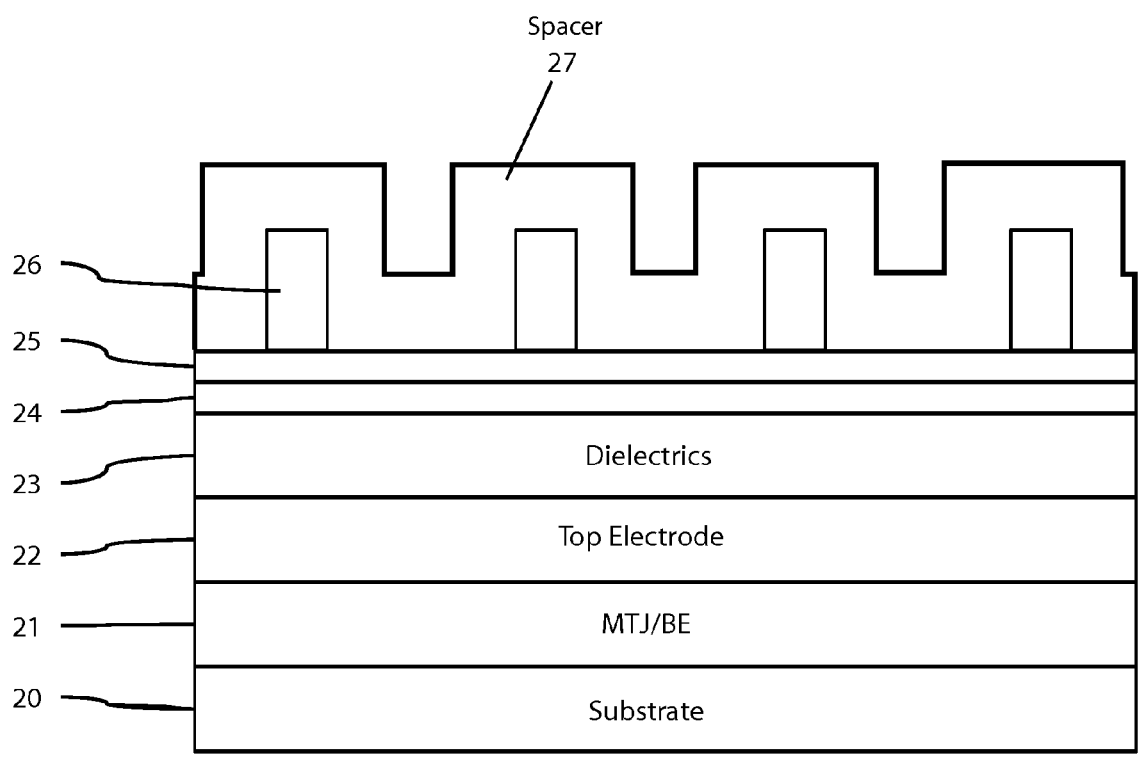
Figure 10C:
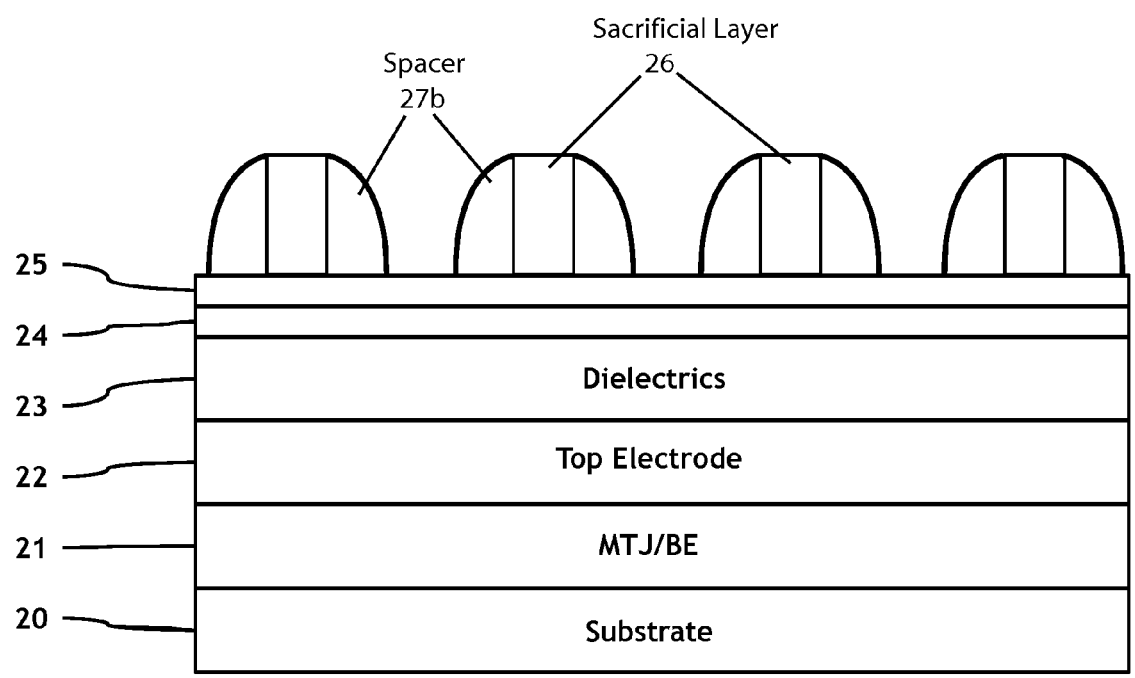
Figure 10D:
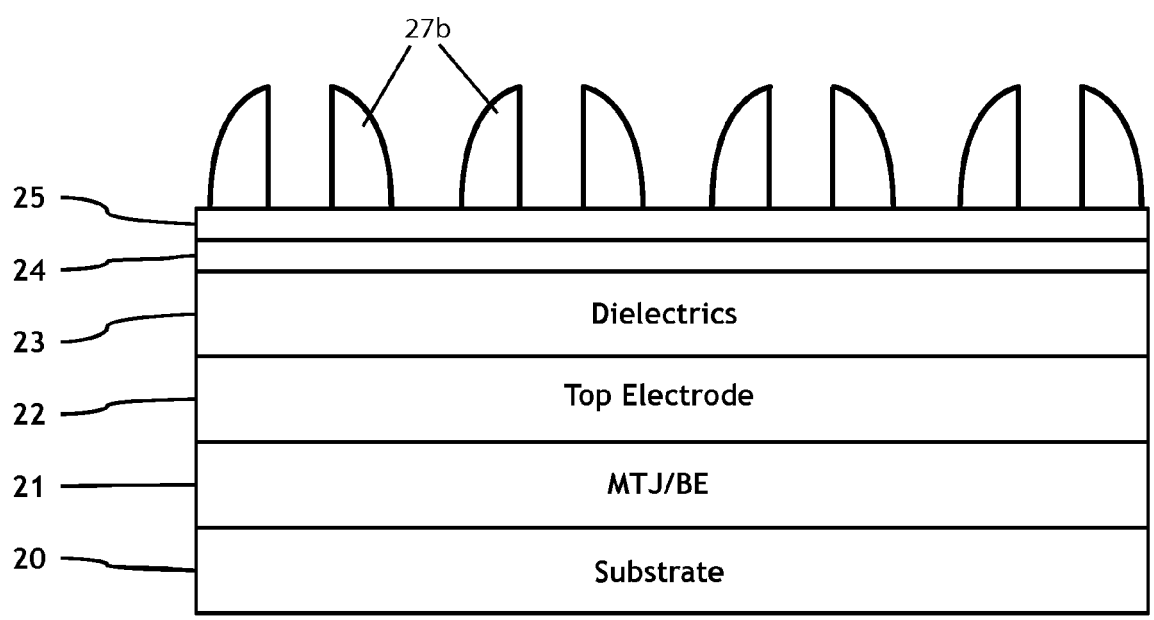
Figure 10E:
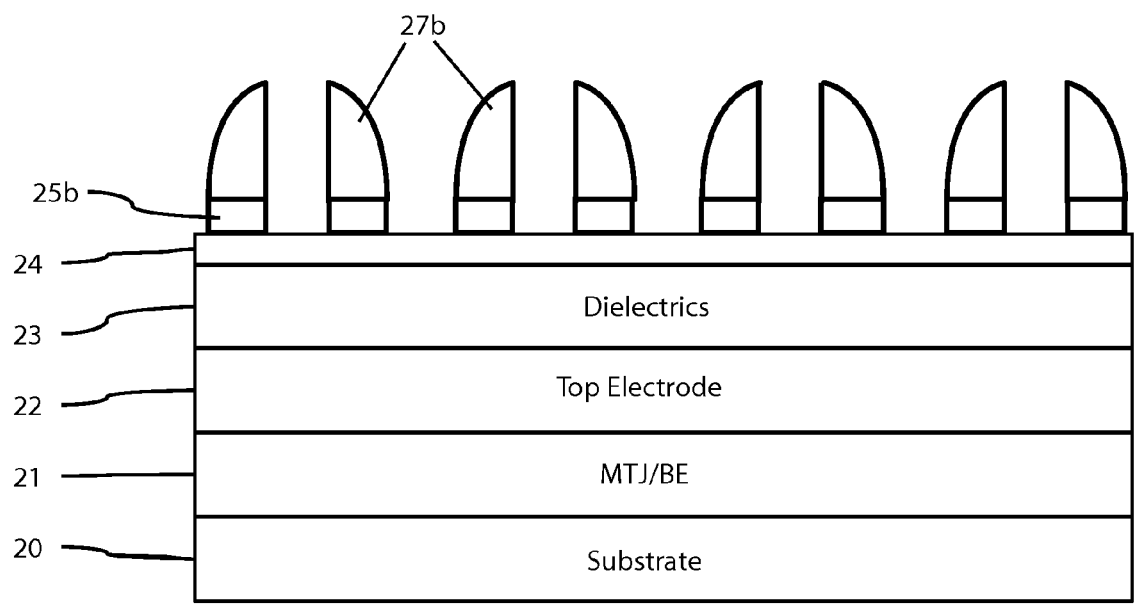

Next in FIG. 10d, the sacrificial lines 26 are removed through $O_2$-ashing or other means, resulting in a line pattern of spacer material 27b of width F/2 at a spacing of F/2. As shown in FIG. 10e, the structure shown in FIG. 10d is etched down through the thin second (upper) dielectric layer 25 is to form dielectric lines 25b with a width F/2 at a spacing of F/2.

Figure 10F:
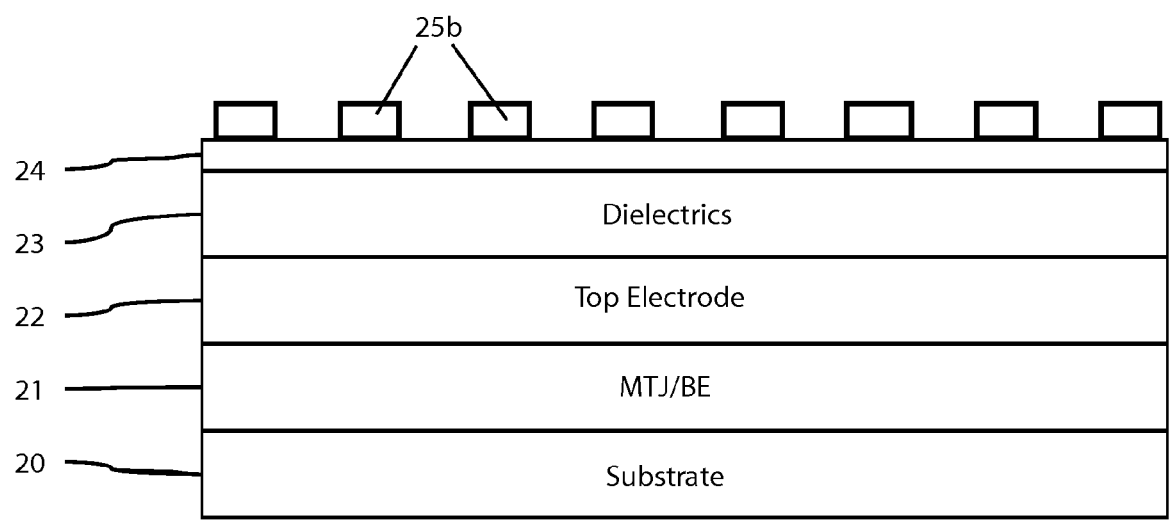

Finally, in FIG. 10f the remaining spacer wedge line material 27b is removed, leaving dielectric pattern mask lines 25b with double the density compared to the initial sacrificial line pattern 26.

In this second embodiment of the present invention, the self-aligned double patterning method shown in FIGS. 10a-f is used to create a dense dielectric line pattern 25b as shown in FIG. 10f that is similar to the dielectric line pattern 15b shown in FIG. 4 and, therefore, the portion method of the first embodiment illustrated in FIGS. 5-9 for creating the second set of orthogonal lines can be executed as described above.

Alternatively, in a third embodiment of the present invention the self-aligned double patterning (SDP) method can be used to form the second set of parallel mask lines which can then be used create the dielectric square or rectangular shape mask pad, similar to the dielectric square or rectangular shape pad 15c as shown in FIG. 6. By using the SDP method for both orthogonal set of mask lines both dimensions can be width F/2. Similar steps as depicted in FIG. 7 and FIG. 8 can follow to achieve a very dense array of MTJ pillars similar to those shown in FIG. 9.

Figure 11:
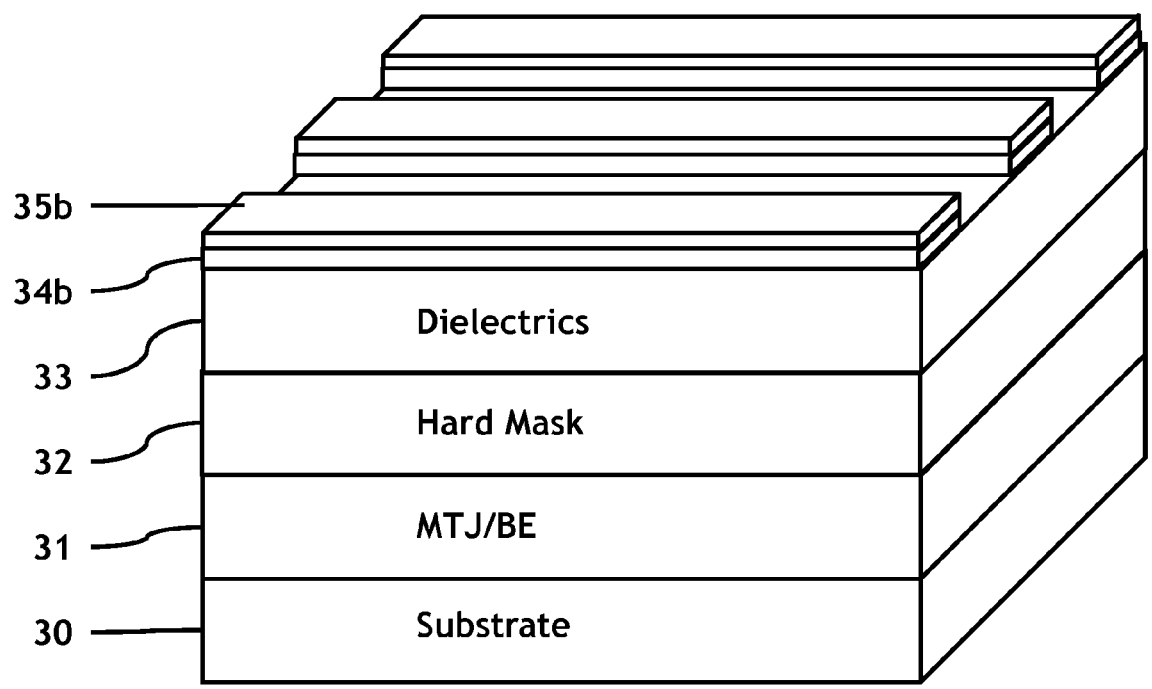

In a fourth embodiment of the present invention, a modified stack structure and process flow from the previous embodiments is used. The first set of mask lines is used to pattern the MTJ/BE layers into lines before the top electrode layer is deposited. Referring now to FIG. 11, the film stack structure of a non-volatile magnetic memory has been deposited on a substrate 30 containing CMOS circuitry (not shown) and means for electrical connections to the MTJ elements that will be patterned. The stack structure consists of the MTJ layer group which in turn consists of the magnetic layers and tunnel barrier as described above. On top of the MTJ and bottom electrode stack (MTJ/BE) 31, a hard mask layer 32 and then first (lower) dielectric layer 33 is deposited. In a preferred embodiment, the hard mask layer 32 is made out of tantalum (Ta).

On top of the dielectric layer 33, a thin metal layer and a thin dielectric layer were deposited and then patterned as described above for the first embodiment to form bilayer lines with an upper dielectric layer 35b and a lower metal layer 34b. The patterning process includes a BARC layer (not shown) coated on top of the thin upper dielectric layer as described in earlier embodiments. Next, a photoresist layer is patterned into lines (not shown) using conventional lithography. The line patterned photoresist layer is then used as an etch mask for etching a line pattern into the thin upper dielectric layer. The etch process uses the thin metal layer as an etch stop. The process produces bilayer lines having a lower metal layer 34b and an upper dielectric layer 35b. In a preferred embodiment, the thin metal layer 34b is made out of Cu.

Figure 12:
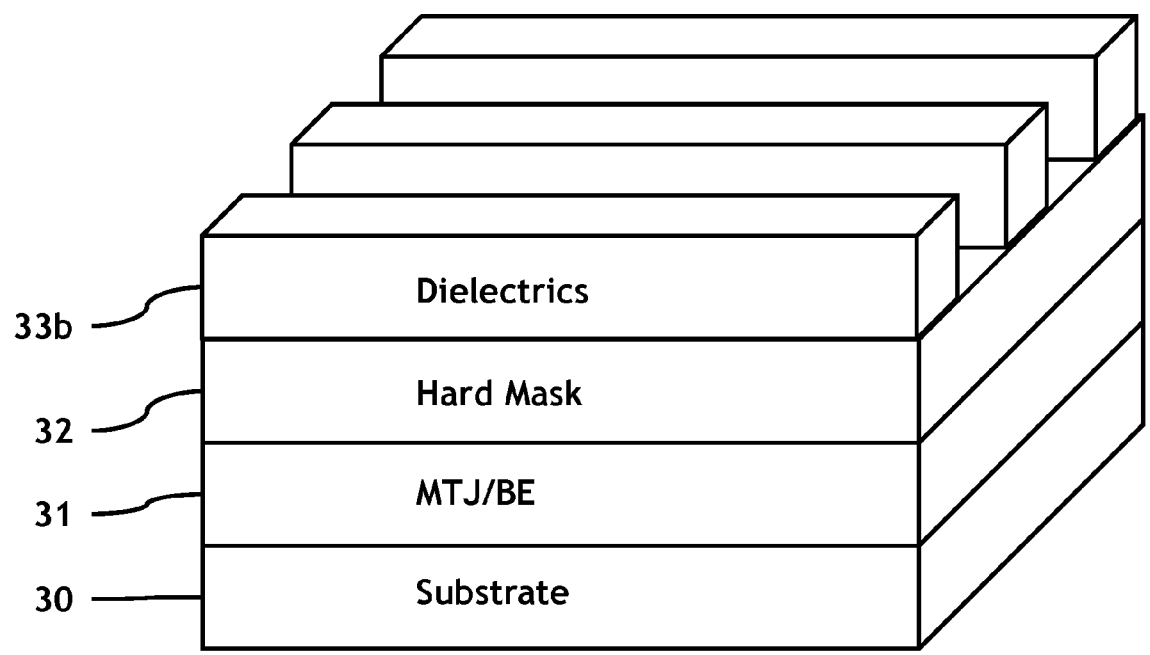

The structure shown in FIG. 11 is etched down through dielectric layer 33 using bilayer lines 34b, 35b as a mask to form the dielectric lines 33b as shown in FIG. 12. The structure shown in FIG. 12 is etched down through hard mask layer 32 to form the hard mask lines 32b shown in FIG. 13. For example, this etching process may use $CF_4$, $Cl_2$, $BCl_3$ plasma or any combination of these with other gases such as Ar, $H_2$ or $O_2$, which has a high etch rate of the hard mask layer 32 compared to the dielectric layer 33b.

Figure 13:
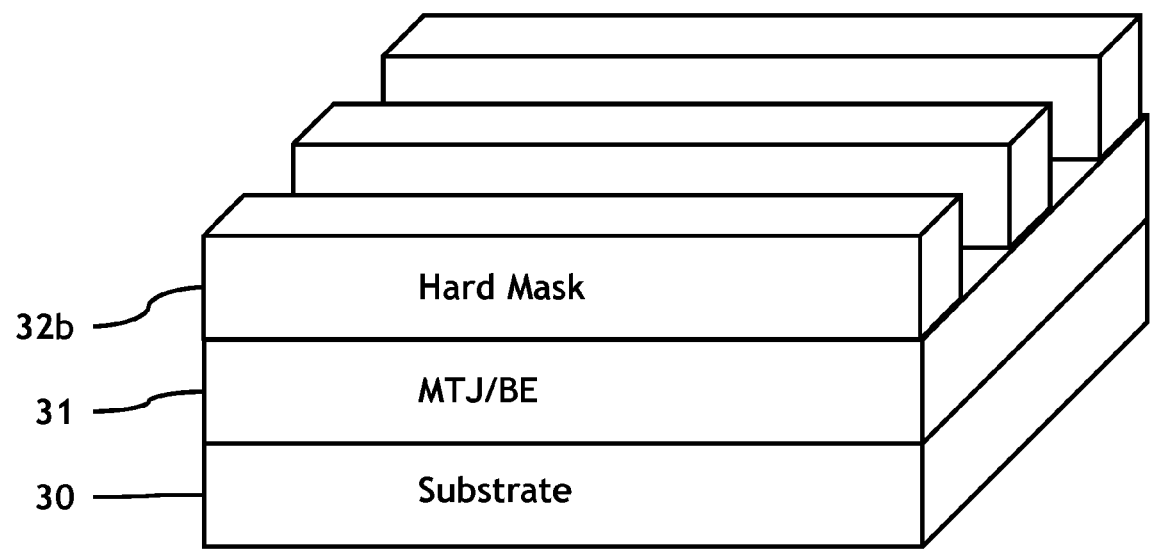
Figure 14:
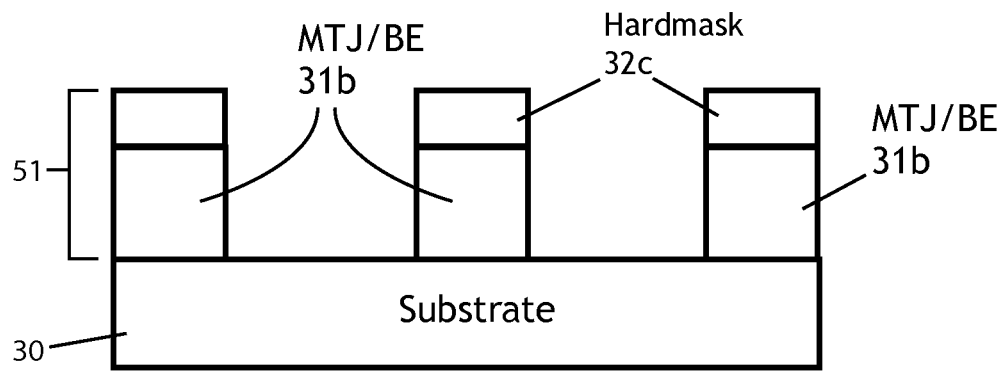

The structure shown in FIG. 13 is etched down through MTJ/BE layer stack 31 using the hard mask line pattern 32b to form the hard mask/MTJ/BE lines 51 which include the remaining hard mask 32c and MTJ/bottom electrode lines 31b shown in FIG. 14 which shows a cross section perpendicular to the substrate and perpendicular to the long axis of the lines. For example, this etching process may use methanol plasma which has a low etch rate of the hard mask layer 32b compared to the MTJ/BE layers 31.

Figure 15:
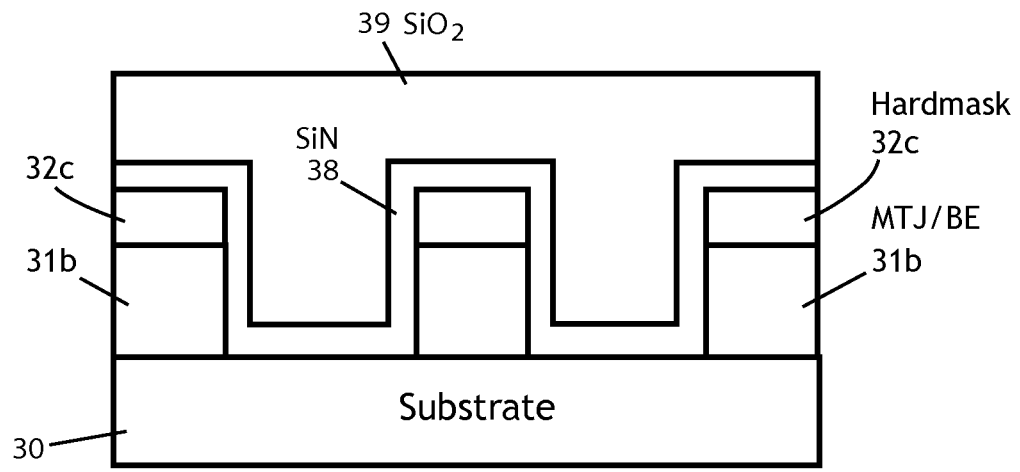

FIG. 15 illustrates a subsequent stage in the process after the stage shown in FIG. 14, after the MTJ/bottom electrode lines 31b with the remaining hard mask layer 32c on top have been encapsulated by first depositing a thin, conformal SiN layer 38 over the wafer to protect the exposed sidewall of the MTJ structure. Over the thin conformal SiN layer 38, a thicker $SiO_2$ layer 39 has been deposited to fill in the gaps between the MTJ/bottom electrode lines 31b and allow planarization.

Figure 16:
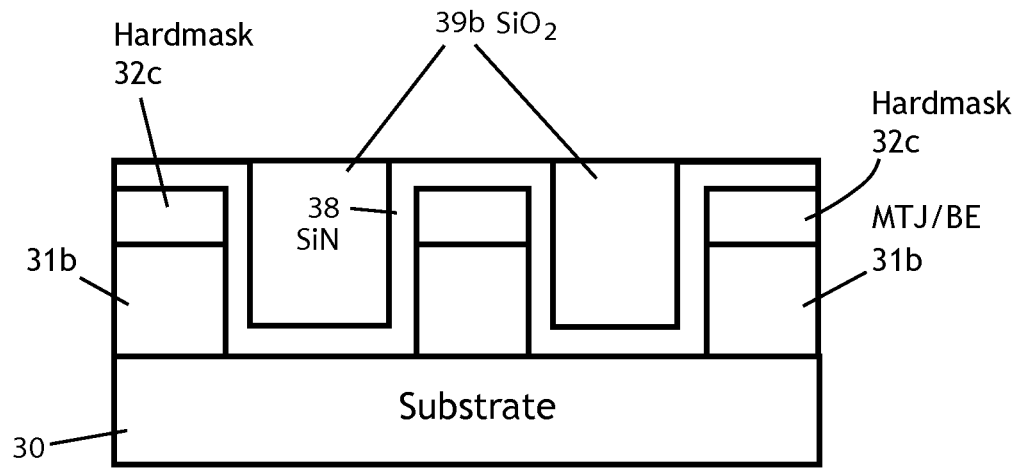

As shown in FIG. 16, the $SiO_2$ layer 39 is planarized using oxide CMP with the SiN layer 38 functioning as a stop layer for the CMP process. The result is $SiO_2$ fill 39b between the SiN encapsulation. The exposed surface of the wafer has alternating lines of $SiO_2$ fill 39b and SiN encapsulation 38.

Figure 17:
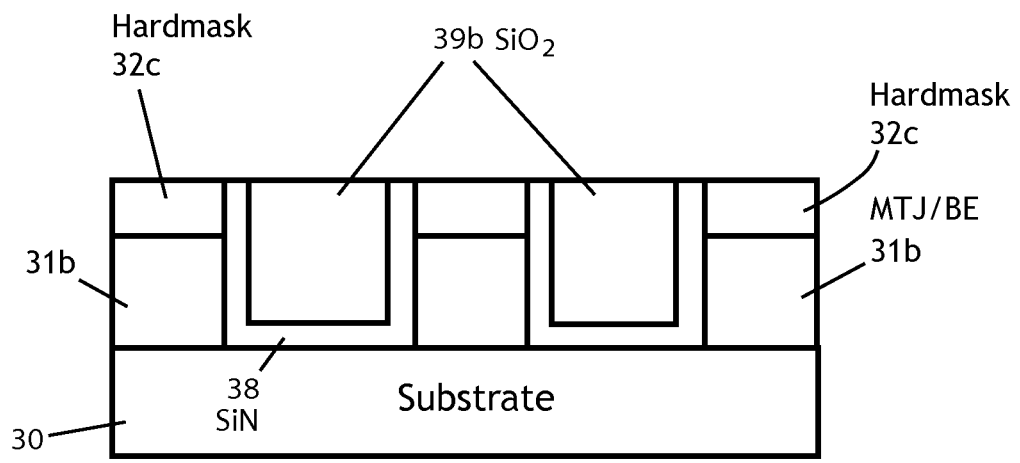
Figure 18:
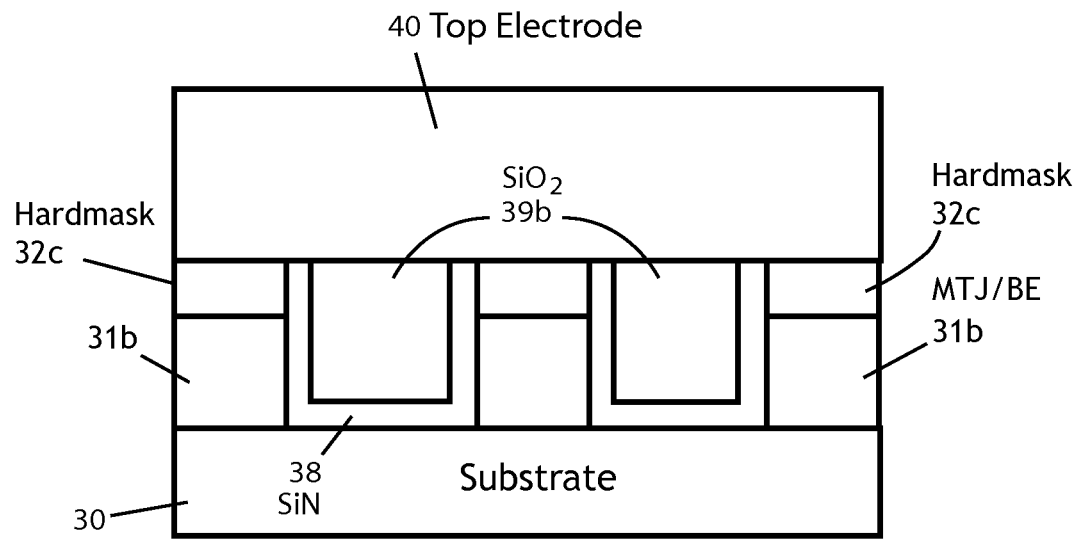

Referring now to FIG. 17, the SiN layer 38 above the hard mask lines 32c has been removed to expose the top of the hard mask lines 32c. For example, the SiN layer 38 is removed by blanket etching using an appropriate gas chemistry. In the same process step, some of the $SiO_2$ layer 39b is also removed. The exposed surface of the wafer now has alternating lines of $SiO_2$ fill 39b, SiN encapsulation 38 and hard mask 32c. As shown in FIG. 18, a top electrode layer 40 has been deposited on top of the hard mask/MTJ/BE lines 32c, 31b and remaining $SiO_2$ fill layer 39b and SiN encapsulation layer 38b.

Figure 19:
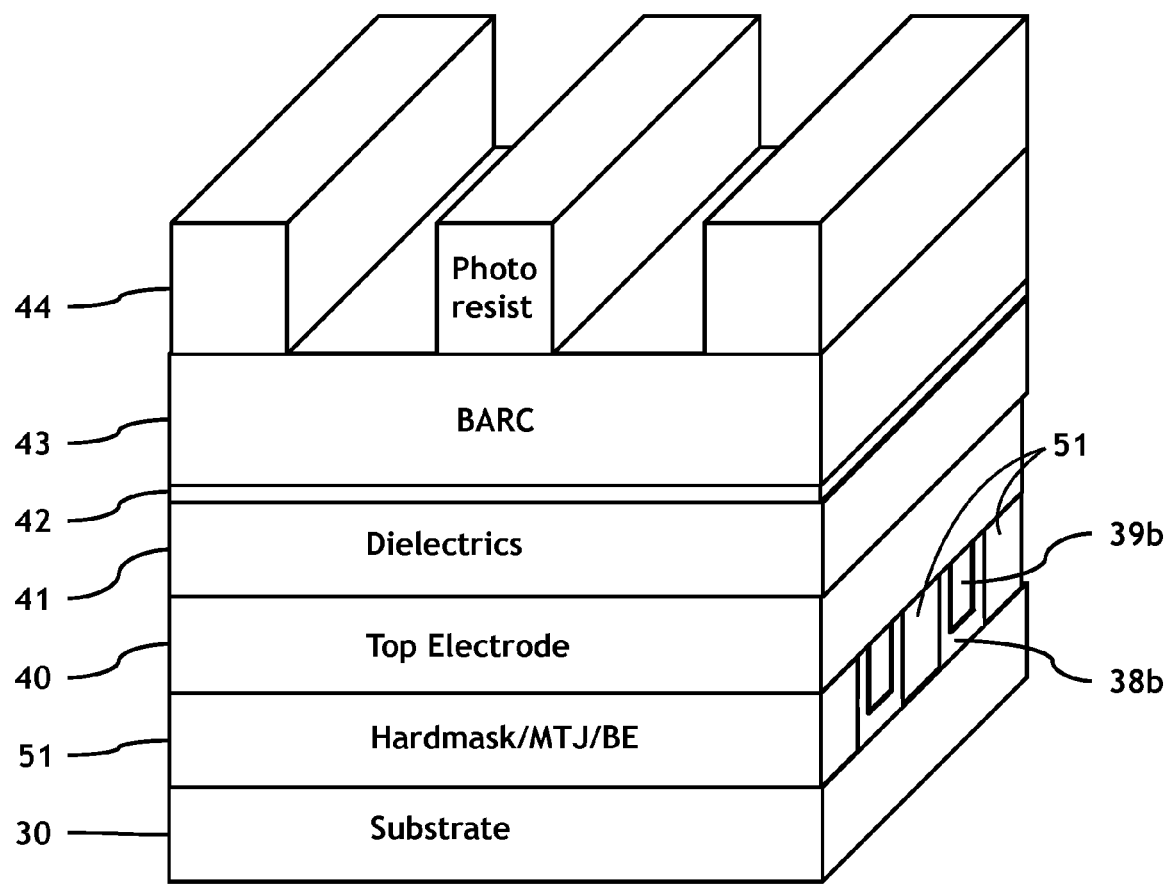

A subsequent stage of the process is illustrated in FIG. 19. For simplicity the hard mask/MTJ/BE lines 51 are shown as a unit. A dielectric layer 41, a thin metal layer 42 and a BARC layer 43 have been deposited over the top electrode layer 40. In a preferred embodiment, the thin metal layer 42 is made of Cu. A photoresist mask 44 has been patterned into lines arranged orthogonally to the direction of the hard mask/MTJ/BE lines 51.

Figure 20:
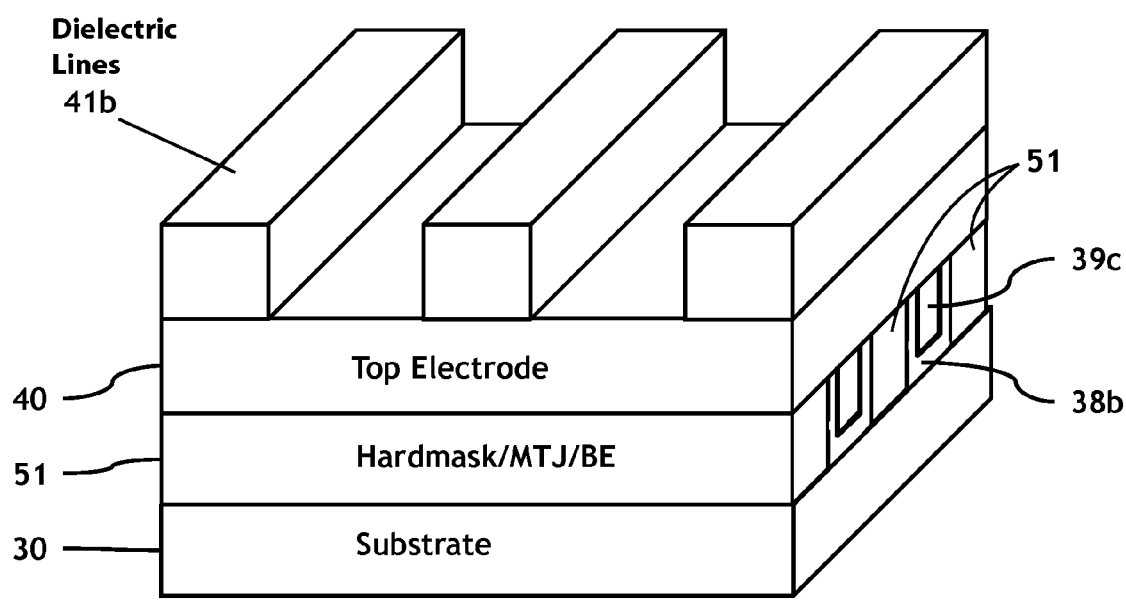
Figure 21A:
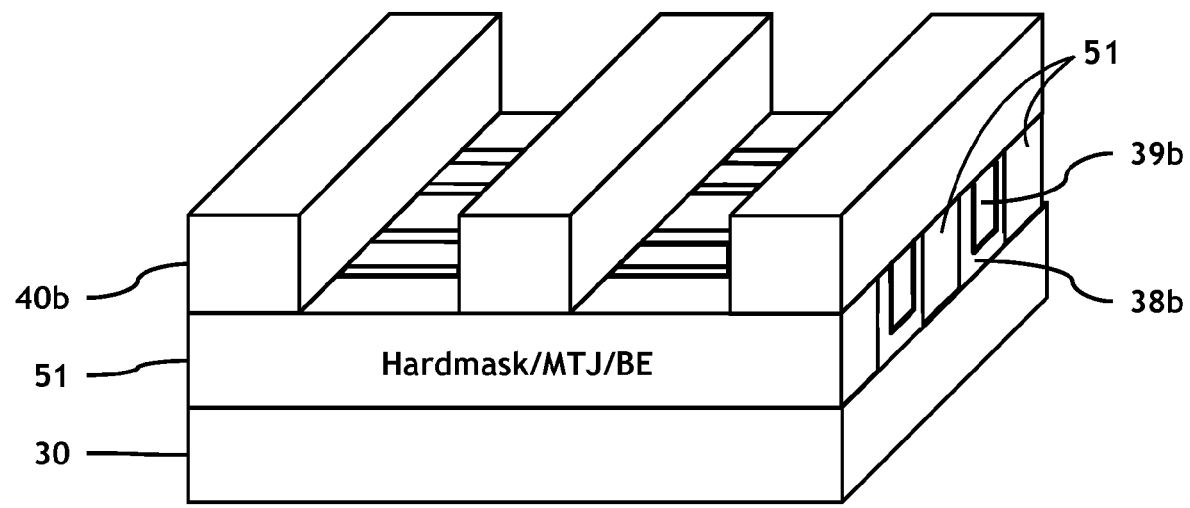
Figure 21B:
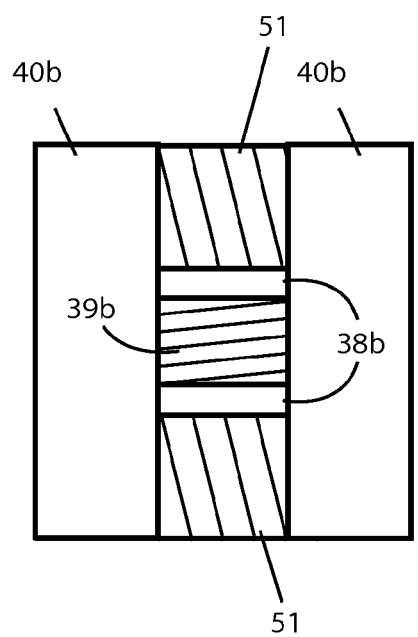

Referring now to FIG. 20, the dielectric lines 41b have been formed by etching using photoresist line mask 44 in FIG. 19. The dielectric lines 41b are then used to form the top electrode lines 40b by another etching process with the result as shown in FIGS. 21a and 21b. For example, this etching process may use $CF_4$, $Cl_2$, $BCl_3$ plasma or any combination of these with other gases such as Ar, $H_2$ or $O_2$, which has a high etch rate of the top electrode layer material compared to the dielectric layer 41b. FIG. 21a is an isometric section view that shows the top electrode lines 40b disposed on the wafer surface. FIG. 21b is a plan view looking down between two of the top electrode lines 40b showing that the exposed surface between the top electrode lines 40b includes tops of the hard mask 32c (which is above MTJ/BE 31b), the SiO₂ fill 39b and SiN encapsulation 38b.

From the stage shown in FIGS. 21a and 21b, the remaining SiO₂ fill 39b and SiN encapsulation 38b not covered by the top electrode lines 40b is removed. The result is illustrated in FIGS. 22a-c. FIG. 22a is a top plan view that shows that the substrate 30 is now exposed where the selected SiO₂ fill 39b and SiN encapsulation 38b have been removed. FIG. 22b shows the cross section view through A-A (labeled in FIG. 22a) with hard mask/MTJ/BE lines 51 disposed on the substrate 30. FIG. 22c shows the cross section view through B-B with top electrode lines 40b disposed SiO₂ fill 39b and SiN encapsulation 38b.

Figure 23A:
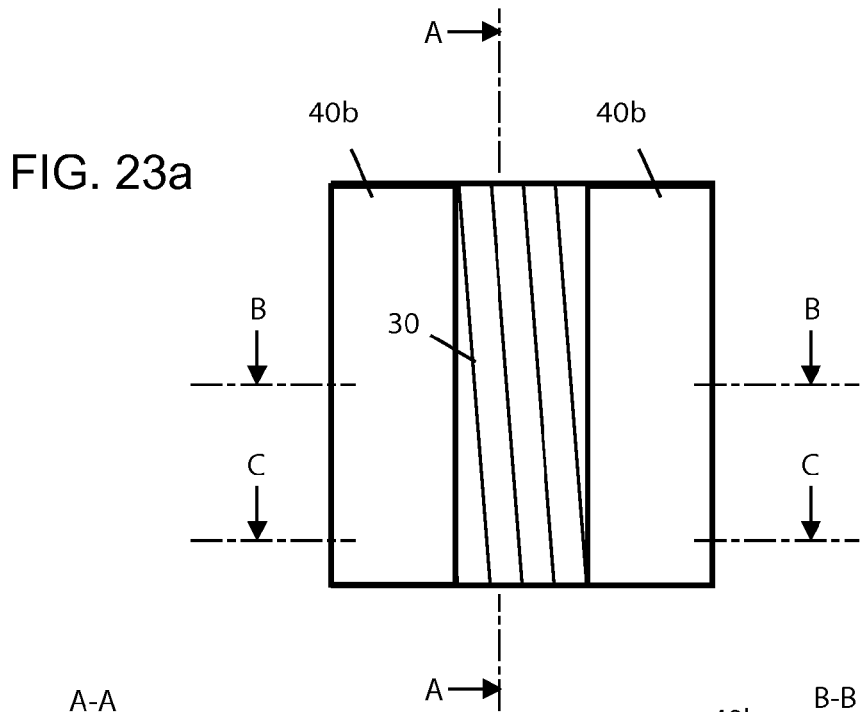
Figure 23B:
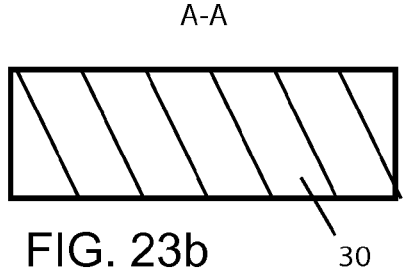
Figure 23C:
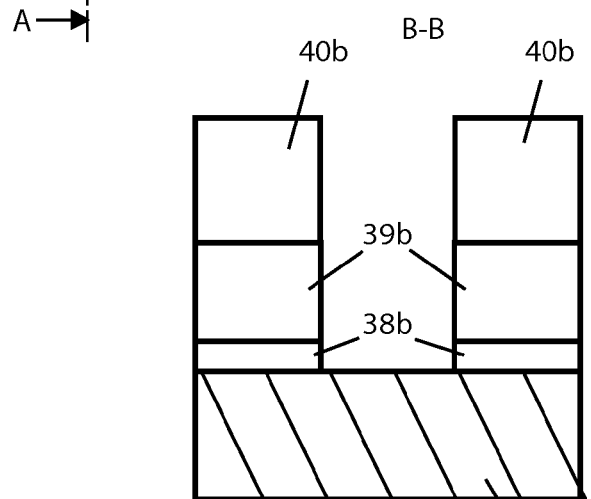
Figure 23D:
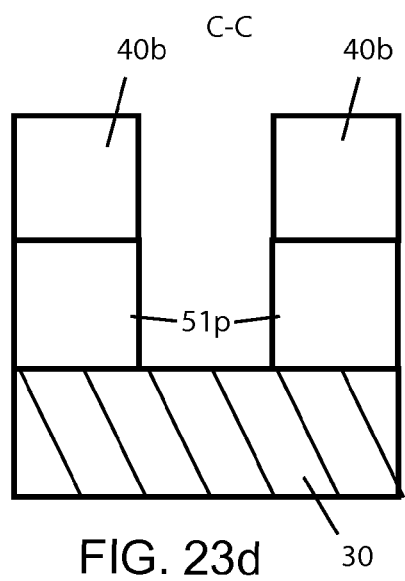
Figure 23E:
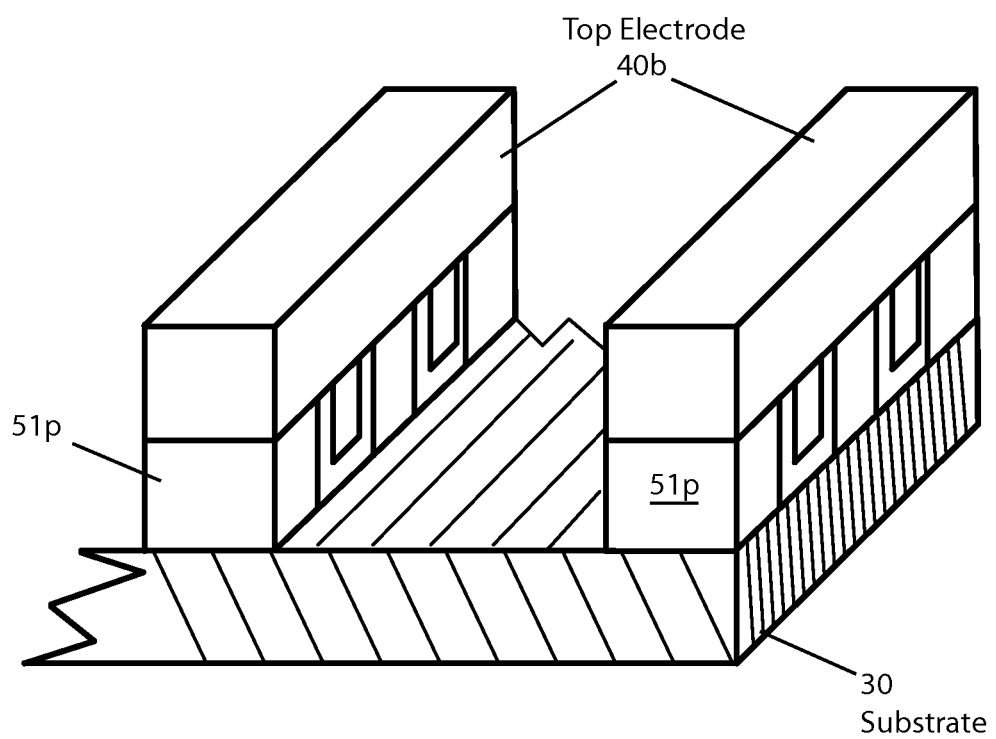

A subsequent stage of the process is illustrated in FIGS. 23a-e. The remaining areas of hard mask/MTJ/BE lines not covered by the top electrode line 40b are removed to form hard mask/MTJ/BE pillars 51p underneath the top electrode line 40b as illustrated isometric section view in FIG. 23e. FIG. 23a is a top plan view that shows that the surface of substrate 30 is now exposed where the selected hard mask/MTJ/BE material has been removed. FIG. 23b shows the cross section view through A-A (labeled in FIG. 23a) which now contains only the substrate 30, which as previously indicated can contain previously patterned circuitry. FIG. 23c shows the cross section view through B-B which has not been changed from that shown in FIG. 22c. FIG. 23d shows the cross section view through C-C showing hard mask/MTJ/BE pillars 51p underneath the top electrode line 40b.

After the hard mask/MTJ/BE element 51p is patterned as described, a conventional process can be resumed. Typically the array of MTJ/BE elements are encapsulated in dielectric material (not shown) and followed by the bitline interconnection process to make electrical contact to the top electrode and providing electrical wiring to the CMOS circuitry in the substrate. This embodiment of the invention thus allows for the hard mask/MTJ/BE pillars 51p to become self-aligned to the top electrode line 40b.

A fifth embodiment of the present invention is an alternative of the fourth embodiment in which the self-aligned double patterning (SDP) method as illustrated in FIGS. 10a-f and described above can be used to create the dielectric line patterns shown in FIG. 4 but with a width F/2 at a spacing of F/2, for example. The subsequent process steps in this embodiment are similar to the steps shown in FIG. 11 to FIG. 18 and described above for the fourth embodiment.

A sixth embodiment is an alternative of the fourth embodiment in which the self-aligned double patterning (SDP) method as illustrated in FIGS. 10a-f a self-aligned double patterning method as illustrated in FIGS. 10a-f and described above is used to create a each of the first and second the orthogonal line patterns similar to arrive at a structure as shown in FIG. 20. The subsequent process steps are similar to the steps shown in FIG. 21a to FIG. 23e and described above but with a width F/2 at a spacing of F/2, for example.

Although the present invention has been described in terms of specific embodiment, it is anticipated that alterations and modifications thereof will no doubt become apparent to those skilled in the art. Such alterations and modifications include, for example, extending the stacks and magnetic tunnel junction from free layer in various three-dimensional conformations, normal to the substrate surface or stacked planes on top, in order to maintain higher capacity. It is therefore intended that the following claims be interpreted as covering all such alterations and modification as fall within the true spirit and scope of the invention.

The invention claimed is:

1. A method for fabricating thin film magnetic memory cells on a wafer comprising:
    depositing a stack of layers for a magnetic memory device on a substrate;
    depositing a lower dielectric layer over the stack of layers for a magnetic memory device;
    depositing a metal layer over the lower dielectric layer;
    depositing an upper dielectric material layer over the metal layer;
    patterning a first line mask of parallel lines of material;
    forming parallel lines in the upper dielectric material by etching through the upper dielectric material layer using the first line mask;
    patterning a second line mask over the parallel lines of upper dielectric material, the second line mask including parallel lines arranged orthogonally to the parallel lines of upper dielectric material and overlapping the parallel lines of upper dielectric material;
    forming pads of upper dielectric material by etching through the parallel lines of upper dielectric layer using the second line mask; and
    forming pillars of layers for the magnetic memory device on the substrate by executing a series of etching processes that successively transfer a shape of the pads of upper dielectric material into layers below the pads of upper dielectric material.

2. The method of claim 1 wherein patterning the first line mask of parallel lines of material further comprises:
    patterning a set of parallel lines of sacrificial material using photo lithography;
    depositing a layer of spacer material over the parallel lines of sacrificial material;
    partially etching the layer of spacer material to leave parallel lines of spacer material disposed on first and second opposite sides of the parallel lines of sacrificial material; and
    removing the parallel lines of sacrificial material to leave parallel lines of spacer material as the first line mask.

3. The method of claim 2 wherein patterning the second line mask of parallel lines of material further comprises:
    patterning a set of parallel lines of sacrificial material using photo lithography;
    depositing a layer of spacer material over the parallel lines of sacrificial material;
    partially etching the layer of spacer material to leave parallel lines of spacer material disposed on first and second opposite sides of the parallel lines of sacrificial material; and
    removing the parallel lines of sacrificial material to leave parallel lines of spacer material as the second line mask.

4. The method of claim 1 wherein patterning the second line mask of parallel lines of material further comprises:
    patterning a set of parallel lines of sacrificial material using photo lithography;
    depositing a layer of spacer material over the parallel lines of sacrificial material;
    partially etching the layer of spacer material to leave parallel lines of spacer material disposed on first and second opposite sides of the parallel lines of sacrificial material; and
    removing the parallel lines of sacrificial material to leave parallel lines of spacer material as the second line mask.

5. The method of claim 1 wherein forming pillars further comprises:
    using a first etching process to etch through the metal layer using the pads of upper dielectric material as a mask to form bilayer pads having an upper pad layer of upper dielectric material and a lower pad layer of metal; and using a second etching process to etch through the lower dielectric layer using the lower pad layer of metal as a mask.

6. The method of claim 1 wherein patterning a second line mask further comprises depositing a planarizing BARC layer over the parallel lines of upper dielectric material.

7. The method of claim 1 wherein the lower dielectric layer or the upper dielectric is an oxide.

8. The method of claim 1 wherein the lower dielectric layer or the upper dielectric is a nitride.

9. The method of claim 1 wherein the metal layer is copper.

* * * * *